(12) United States Patent
Byun et al.

(10) Patent No.: US 11,922,037 B2
(45) Date of Patent: Mar. 5, 2024

(54) CONTROLLER, STORAGE DEVICE AND OPERATION METHOD OF STORAGE DEVICE

(71) Applicant: Samsung Electronics Co., Ltd., Suwon-si (KR)

(72) Inventors: Hyungkyun Byun, Yongin-si (KR); Seongcheol Hong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/867,051

(22) Filed: Jul. 18, 2022

(65) Prior Publication Data

US 2023/0135020 A1    May 4, 2023

(30) Foreign Application Priority Data

Nov. 2, 2021 (KR) .................. 10-2021-0149026

(51) Int. Cl.
*G06F 12/00* (2006.01)
*G06F 3/06* (2006.01)

(52) U.S. Cl.
CPC ............ *G06F 3/064* (2013.01); *G06F 3/0656* (2013.01); *G06F 3/0658* (2013.01); *G06F 3/0679* (2013.01)

(58) Field of Classification Search
CPC ...... G06F 3/064; G06F 3/0656; G06F 3/0658; G06F 3/0679; G06F 11/004; G06F 2212/1016; G06F 2212/7203; G06F 2212/7204; G06F 2212/7208; G06F 3/061; G06F 3/0659; G06F 11/1048; G06F 12/0246; G11C 7/1015; G11C 2211/5648; G11C 16/08; G11C 11/5628
(Continued)

(56) References Cited

U.S. PATENT DOCUMENTS

| 7,679,133 B2 | 3/2010 | Son et al. |
| 8,553,466 B2 | 10/2013 | Han et al. |

(Continued)

FOREIGN PATENT DOCUMENTS

| JP | H11-119917 A | 4/1999 |
| JP | 3782982 | * 1/2006 |

(Continued)

*Primary Examiner* — Mardochee Chery
(74) *Attorney, Agent, or Firm* — Harness, Dickey & Pierce, P.L.C.

(57) ABSTRACT

A storage device includes a plurality of nonvolatile memories, each including a plurality of memory blocks and a controller configured to control the plurality of nonvolatile memories, in which the controller is configured to buffer data chunks received along with write commands from a host, is configured to determine a size of continuous data based on a start logical address and a chunk size of the data chunks, is configured to determine a striping number indicating a number of nonvolatile memory which is for distributing and storing the data chunks in sub-page units based on the size of continuous data, and is configured to provide the data chunks to one or more nonvolatile memories selected from among the plurality of nonvolatile memories based on the determined striping number and the one or more selected nonvolatile memories are configured to perform a programming operation on the data chunks in parallel.

20 Claims, 19 Drawing Sheets

(58) Field of Classification Search
USPC .......................................................... 711/154
See application file for complete search history.

(56) References Cited

U.S. PATENT DOCUMENTS

| | | | |
|---|---|---|---|
| 8,559,235 B2 | 10/2013 | Yoon et al. | |
| 8,566,508 B2 | 10/2013 | Borchers et al. | |
| 8,654,587 B2 | 2/2014 | Yoon et al. | |
| 10,101,942 B1 * | 10/2018 | Parker | G06F 12/0246 |
| 11,037,625 B2 | 6/2021 | Peddle et al. | |
| 2011/0233648 A1 | 9/2011 | Seol et al. | |
| 2012/0124276 A1 | 5/2012 | Ahn et al. | |
| 2016/0259598 A1 | 9/2016 | Ikeuchi et al. | |
| 2018/0357160 A1 * | 12/2018 | Gorobets | G06F 3/064 |
| 2020/0150899 A1 | 5/2020 | Kim et al. | |
| 2020/0174701 A1 | 6/2020 | Jung | |
| 2020/0201548 A1 | 6/2020 | Yim et al. | |
| 2020/0310986 A1 | 10/2020 | Kang | |
| 2020/0371715 A1 | 11/2020 | Lee | |
| 2020/0381054 A1 | 12/2020 | Kim et al. | |
| 2020/0401328 A1 | 12/2020 | Lee | |
| 2021/0055864 A1 | 2/2021 | Noh et al. | |
| 2021/0326061 A1 | 10/2021 | Park | |
| 2022/0013191 A1 * | 1/2022 | Bhatia | G11C 16/0483 |

FOREIGN PATENT DOCUMENTS

| | | | | |
|---|---|---|---|---|
| JP | 3782982 B2 * | 6/2006 | ....... | G06F 11/1076 |
| JP | 2016-162407 A | 9/2016 | | |
| KR | 10-2012-0052028 A | 5/2012 | | |
| KR | 101280792 B1 | 7/2013 | | |
| KR | 10-2020-0053204 A | 5/2020 | | |
| KR | 10-2020-0067038 A | 6/2020 | | |
| KR | 10-2020-0113480 A | 10/2020 | | |
| KR | 10-2020-0134784 A | 12/2020 | | |
| KR | 10-2020-0136747 A | 12/2020 | | |
| KR | 10-2021-0128780 A | 10/2021 | | |

* cited by examiner

CONTROLLER, STORAGE DEVICE AND OPERATION METHOD OF STORAGE DEVICE

CROSS-REFERENCE TO RELATED APPLICATION(S)

This application claims the benefit under 35 USC 119(a) of Korean Patent Application No. 10-2021-0149026 filed on Nov. 2, 2021 in the Korean Intellectual Property Office, the entire disclosure of which is incorporated herein by reference for all purposes.

BACKGROUND

The present inventive concepts relate to a controller, a storage device, and an operating method of a storage device.

SUMMARY

A semiconductor memory is divided into a volatile memory device in which stored data is lost when a supply of power is cut off and a nonvolatile memory device in which stored data is retained, even when a supply of power is cut off.

To store a large amount of data, in general, a nonvolatile memory may be used. However, due to a limitation of a transfer speed of such a nonvolatile memory, latency may occur in storing a large amount of data. To reduce latency in storing data, a plurality of nonvolatile memories may be used. A memory controller controlling the nonvolatile memory may perform striping using the plurality of nonvolatile memories. Striping is a technique of distributing and storing data in the nonvolatile memories.

The number of nonvolatile memories in which data is stored may vary according to the striping number. As the striping number increases, write performance of a storage device may be improved, and read performance of continuous data may be improved. However, in an environment in which a host frequently provides a flush command to store data buffered in a buffer memory in the nonvolatile memory, when the striping number increases, write amplification (WAF) may occur.

Example embodiments provide configurations and operations related to a storage device capable of dynamically changing a striping policy by analyzing a pattern of data received from a host.

Example embodiments also provide a storage device in which write amplification is alleviated while providing improved performance.

According to example embodiments, a storage device includes a plurality of nonvolatile memories, each including a plurality of multi-level cell memory blocks including a plurality of pages including multi-level memory cells storing plural bits of data, each of the plurality of pages providing sub-pages corresponding to a memory cell level, and each of the plurality of nonvolatile memories performing high-speed programming (HSP) operation to program the sub-pages included one of the plurality of pages in one-time operation and a controller configured to control the plurality of nonvolatile memories, in which the controller is configured to buffer data chunks received along with write commands from a host, configured to determine a size of continuous data based on a start logical address and a chunk size of the data chunks, is configured to determine a striping number indicating a number of nonvolatile memory which is for distributing and storing the data chunks in sub-page units based on the size of continuous data, and is configured to distribute and provide the data chunks in the sub-page unit to one or more nonvolatile memories selected from among the plurality of nonvolatile memories based on the determined striping number and the one or more selected nonvolatile memories are configured to perform the HSP operation on the provided data chunks in parallel.

According to example embodiments, an operation method of a storage device including a plurality of nonvolatile memories each including multi-level cell memory blocks including a plurality of pages includes receiving a write command, a start logical address, a current data chunk, and chunk size information from a host, determining a size of continuous data based on the start logical address and the chunk size information, determining a striping number indicating a number of nonvolatile memory which is for distributing and storing the data chunks in sub-page units provided in each of the plurality of pages according to memory cell level, based on the size of continuous data, providing the data chunk to one or more nonvolatile memories selected from among the plurality of nonvolatile memories based on the determined striping number, and performing, with the one or more selected nonvolatile memories, a high-speed programming (HSP) operation to program sub-pages including one of the plurality of pages in one-time operation on the provided data chunks in parallel.

According to example embodiments, a controller configured to control a plurality of nonvolatile memories each including multi-level cell memory blocks each including a plurality of pages includes a buffer memory configured to buffer data received along with write commands from a host, and a processor configured to determine a size of continuous data based on a logical address and a chunk size of the buffered data, configured to determining a striping number indicating a number of nonvolatile memory for distributing and storing the buffered data in sub-page units corresponding memory cell level in one page based on the size of continuous data, and configured to provide the buffered data to at least one nonvolatile memory selected from among the plurality of nonvolatile memories based on the determined striping number to be programmed the buffered data in sub-pages included in one page in one-time operation.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, example embodiments will be described with reference to the accompanying drawings.

Figure 1:
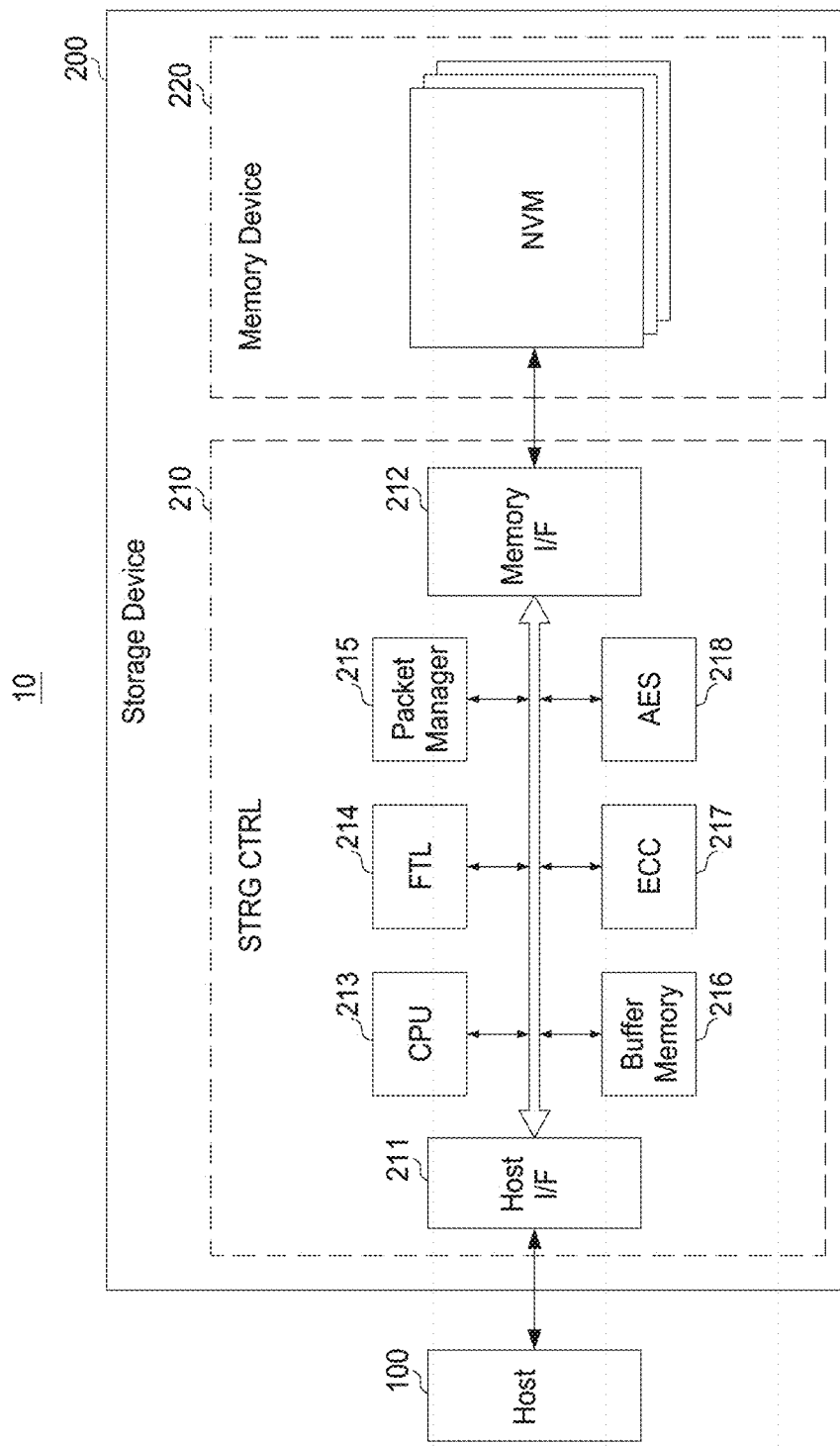
FIG. 1 is a block diagram illustrating a host-storage system according to example embodiments.

FIG. 1 is a block diagram illustrating a host-storage system according to example embodiments.

The host-storage system 10 may include a host 100 and a storage device 200. In addition, the storage device 200 may include a storage controller 210 and/or a nonvolatile memory (NVM) 220.

The host 100 may include electronic devices, for example, portable electronic devices such as mobile phones, MP3 players, and laptop computers, or electronic devices such as desktop computers, game machines, TVs, and projectors. The host 100 may include at least one operating system (OS). The operating system may generally manage and control functions and operations of the host 100.

The storage device 200 may include storage media for storing data according to a request from the host 100. As an example, the storage device 200 may include at least one of a solid state drive (SSD), an embedded memory, and a removable external memory. When the storage device 200 is the SSD, the storage device 200 may be a device according to a nonvolatile memory express (NVMe) standard. When the storage device 200 is the embedded memory or the external memory, the storage device 200 may be a device according to a universal flash storage (UFS) or an embedded multi-media card (eMMC) standard. The host 100 and the storage device 200 may each generate and transmit a packet according to an adopted standard protocol.

The memory device 220 may include a plurality of nonvolatile memories (NVM). The nonvolatile memory (NVM) may retain stored data even when a supply of power is cut off. The nonvolatile memory (NVM) may store data provided from the host 100 through a programming operation, and may output data stored in the nonvolatile memory NVM through a read operation.

The nonvolatile memories (NVMs) may independently perform the programming operation and the read operation. The storage device 200 may perform a striping operation in which data provided from the host 100 is distributed and stored in the nonvolatile memories (NVMs). For example, when the storage controller 210 distributes and provides data from the host 100 to nonvolatile memories (NVM), the nonvolatile memories (NVMs) operate in parallel to quickly program the distributed and provided data.

The nonvolatile memory (NVM) may include a plurality of memory blocks. Each of the memory blocks may include a memory cell. The memory blocks may have different bit densities according to a memory cell level, that is, the number of data bits that one memory cell may store. In order to program data into a memory block in which one memory cell may store a plurality of data bits, the nonvolatile memory (NVM) may perform a high speed program (HSP) operation in which the plurality of data bits are programmed in one-time operation. One page may provide sub-pages including data bits of the same level in memory cells included in the page. When one HSP operation is performed on one page, sub-pages included in the page may be programmed.

When the memory device 220 includes a flash memory, the flash memory may include a 2D NAND memory array or a 3D (or vertical) NAND (VNAND) memory array. As another example, the storage device 200 may include other various types of nonvolatile memories. For example, examples of the storage device 200 may include a magnetic RAM (MRAM), a spin-transfer torque MRAM, a conductive bridging RAM (CBRAM), a ferroelectric RAM (Fe-RAM), a phase RAM (PRAM), a resistive RAM, and various other types of memories.

The storage controller 210 may include a host interface 211, a memory interface 212, and/or a central processing unit (CPU) 213. In addition, the storage controller 210 may further include a flash translation layer (FTL) 214, a packet manager 215, a buffer memory 216, an error correction code (ECC) engine 217, and/or an advanced encryption standard (AES) engine 218. The storage controller 210 may further include a working memory (not illustrated) into which the flash translation layer (FTL) 214 is loaded, and the CPU 213 may execute the FTL 214 to control a data program and the read operation for the memory device 220.

The host interface 211 may transmit and receive a packet to and from the host 100. The packet transmitted from the host 100 to the host interface 211 may include a command, data to be programmed in the memory device 220, or the like, and the packet transmitted from the host interface 211 to the host 100 may include a response to the command, data read from the memory device 220, or the like.

The memory interface 212 may transmit the data to be programmed in the memory device 220 to the memory device 220 or receive the data read from the memory device 220. The memory interface 212 may be implemented to comply with a standard protocol such as a toggle or an open NAND flash interface (ONFI).

The FTL 214 may perform various functions such as address mapping, wear-leveling, and garbage collection.

The address mapping operation is an operation of changing a logical address received from the host 100 into a physical address used to actually store data in the memory device 220. For example, the FTL 214 may select one or more nonvolatile memories (NVM) for a striping operation, and may perform address mapping so that data may be distributed and stored in the selected nonvolatile memory (NVM). The logical address may be a logical block address (LBA) used in the file system of the host 100.

Wear-leveling is a technique for reducing or preventing excessive deterioration of a specific block by allowing blocks in the memory device 220 to be used uniformly. For example, it can be implemented through a firmware technology that balances erase counts of physical blocks. The garbage collection is a technique for securing usable capacity in the memory device 220 by copying valid data of a block to a new block and then erasing the existing block.

The packet manager 215 may generate a packet according to the protocol of the interface negotiated with the host 100 or parse various information from the packet received from the host 100.

The buffer memory 216 may temporarily store data to be programmed into the memory device 220 or data to be read from the memory device 220. The data received from the host 100 may be first buffered in the buffer memory 216. When data greater than a predetermined or alternatively, desired or given size is buffered in the buffer memory 216 or when there is a request from the host 100, the data buffered in the buffer memory 216 may be programmed in the memory device 220. The operation of programming the buffered data into the memory device 220 may be referred to as a flush operation, and a command provided by the host 100 to request a flush operation from the storage device 200 may be referred to as a flush command. The buffer memory 216 may have a configuration provided in the storage controller 210, but may be disposed outside the storage controller 210.

The ECC engine 217 may perform an error detection and correction function for read data read from the memory device 220. More specifically, the ECC engine 217 may generate parity bits for write data to be written into the memory device 220, and may store the generated parity bits in the memory device 220 together with the write data. When data is read from the memory device 220, the ECC engine 217 may correct an error in the read data using parity bits read from the memory device 220 together with the read data, and output the error-corrected read data.

The AES engine 218 may perform at least one of an encryption operation and a decryption operation on data input to the storage controller 210 using a symmetric-key algorithm.

The host 100 may periodically provide a flush command to reduce or prevent data buffered in the buffer memory 216 from being lost due to a sudden power off (SPO). When the flush operation is frequently performed, the loss of data from the host 100 may be reduced or prevented, but write amplification (WAF) may occur.

For example, a data size that may be programmed into the memory device 220 at once, that is, a programming size, may be determined in advance. When the size of the data buffered in the buffer memory 216 is smaller than the programming size when receiving the flush command from the host 100, the storage device 200 may add dummy data to the buffered data to program the data. Alternatively, the storage device 200 may temporarily program the buffered data in the backup program area of the memory device 220 and then combine the buffered data with the data buffered in the buffer memory 216 later to program the data in the main program area. An operation of programming data by adding the dummy data to the buffered data or an operation of temporarily programming the buffered data in the backup program area may cause the write amplification.

As the number of nonvolatile memories (NVMs) in which data is stripped increases, the programming size may increase. As the programming size increases, the write performance of the storage device 200 and the read performance of continuous data may be improved. However, as the programming size increases, the amount of dummy data added or the amount of data temporarily programmed in the backup program area may increase, so the write amplification may become more severe.

According to example embodiments, the storage device 200 may analyze a pattern of data received from the host 100 and determine the striping number based on the analyzed pattern in order to trade off an advantage of a large striping number and an advantage of a small striping number. The striping number may indicate the number of nonvolatile memories which is a target for distributing data chunks in units of sub-pages.

For example, the storage device 200 may determine the striping number to be larger as the continuity of data received from the host 100 increases, so the storage device 200 may distribute and store continuous data over the plurality of nonvolatile memories (NVMs). In addition, the storage device 200 may store random data in one or a small number of nonvolatile memories (NVMs) by determining the striping number to be smaller as the continuity of data received from the host 100 decreases.

According to example embodiments, the read performance of continuous data may be improved, and the write amplification of the memory device 220 may be alleviated despite frequent flush commands from the host 100.

Hereinafter, the storage device according to example embodiments will be described in detail with reference to FIGS. 2 to 14.

Figure 2:
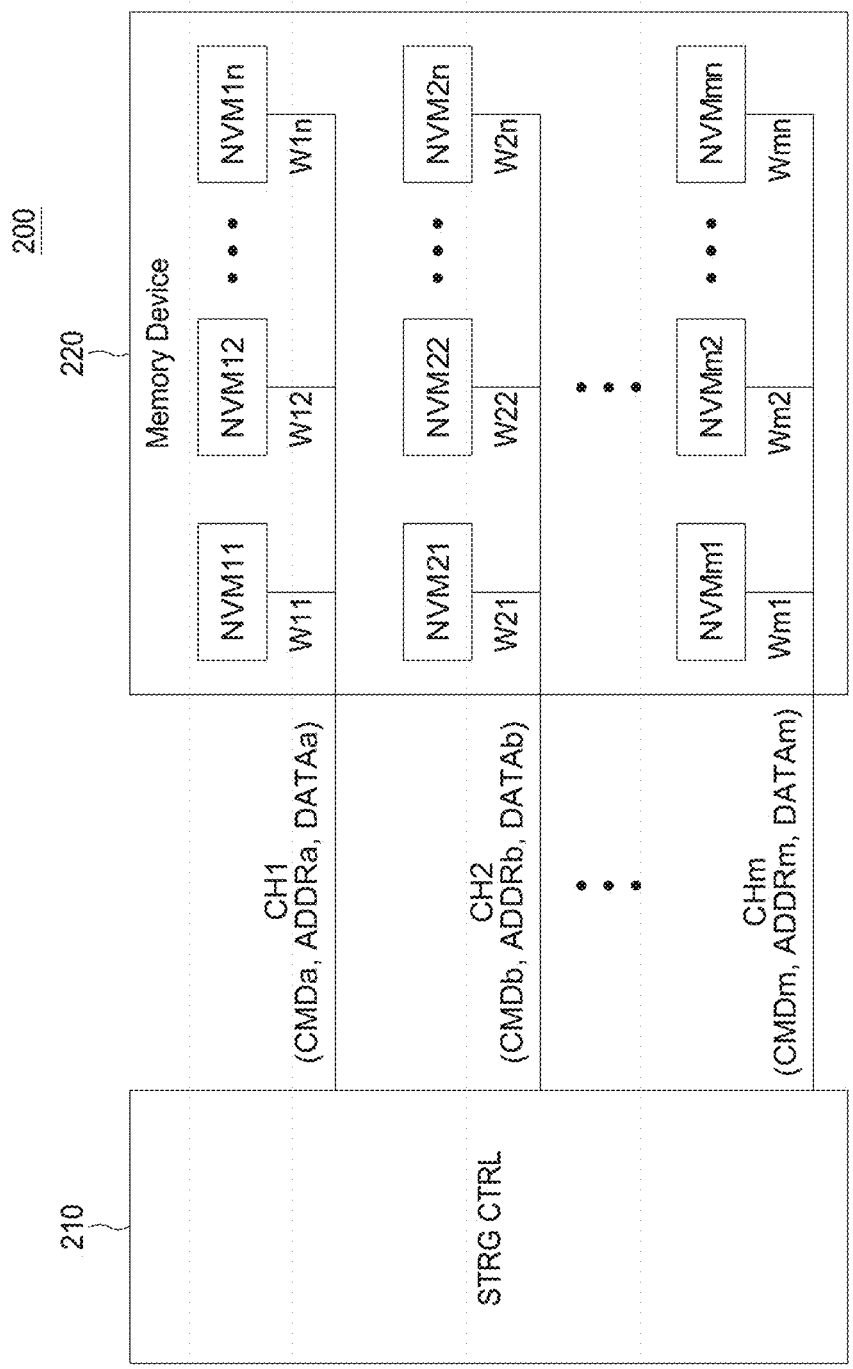
FIG. 2 is a block diagram illustrating a storage device according to example embodiments.

FIG. 2 is a block diagram illustrating the storage device according to example embodiments.

Referring to FIG. 2, the storage device 200 may include a memory device 220 and/or a storage controller 210. The memory device 220 and the storage controller 210 of FIG. 2 may correspond to those described with reference to FIG. 1.

The storage device 200 may support a plurality of channels CH1 to CHm, and the memory device 220 and the storage controller 210 may be connected through the plurality of channels CH1 to CHm. For example, the storage device 200 may be implemented as the storage device such as the solid state drive (SSD).

The memory device 220 may include a plurality of nonvolatile memories NVM11 to NVMmn Each of the nonvolatile memories NVM11 to NVMmn may be connected to one of the plurality of channels CH1 to CHm through a corresponding way. For example, the nonvolatile memories NVM11 to NVM1$n$ may be connected to the first channel CH1 through ways W11 to W1$n$, and the nonvolatile memories NVM21 to NVM2$n$ may be connected to the second channel CH2 through ways W21 to W2$n$. In example embodiments, each of the nonvolatile memories NVM11 to NVMmn may be implemented as an arbitrary memory unit that may operate according to an individual command from the storage controller 210. For example, each of the nonvolatile memories NVM11 to NVMmn may be implemented as a chip or a die, but example embodiments are not limited thereto.

The storage controller 210 may transmit/receive signals to and from the memory device 220 through the plurality of channels CH1 to CHm. For example, the storage controller 210 may transmit commands CMDa to CMDm, addresses ADDRa to ADDRm, and data DATAa to DATAm to the memory device 220 through the channels CH1 to CHm, or receive data DATAa to DATAm from the memory device 220.

The storage controller 210 may select one of the nonvolatile memories NVM11 to NVMmn connected to the corresponding channel through each channel, and transmit/receive signals to and from the selected nonvolatile memory. For example, the storage controller 210 may select the nonvolatile memory NVM11 from among the nonvolatile memories NVM11 to NVM1$n$ connected to the first channel CH1. The storage controller 210 may transmit the command CMDa, the address ADDRa, and the data DATAa to the selected nonvolatile memory NVM11 through the first channel CH1 or receive the data DATAa from the selected nonvolatile memory NVM11.

The storage controller 210 may transmit/receive signals to and from the memory device 220 in parallel through different channels. For example, the storage controller 210 may transmit the command CMDb to the memory device 220 through the second channel CH2 while transmitting the command CMDa to the memory device 220 through the first channel CH1. For example, the storage controller 210 may receive the data DATAb from the memory device 220 through the second channel CH2 while receiving the data DATAa from the memory device 220 through the first channel CH1.

When the nonvolatile memories NVM11 to NVMmn may operate in parallel, the operation performance of the storage device 200 may be improved. The storage controller 210 may distribute and provide data to nonvolatile memories selected from the nonvolatile memories NVM11 to NVMmn, and perform the striping operation of controlling the memory device 220 to simultaneously program the distributed and provided data to the selected nonvolatile memories.

FIG. 2 illustrates that the memory device 220 communicates with the storage controller 210 through m channels, and the memory device 220 includes n nonvolatile memories corresponding to each channel, but the number of channels and the number of nonvolatile memories connected to one channel may be variously changed.

The nonvolatile memory included in the memory device will be described in more detail with reference to FIGS. 3 to 5.

Figure 3:
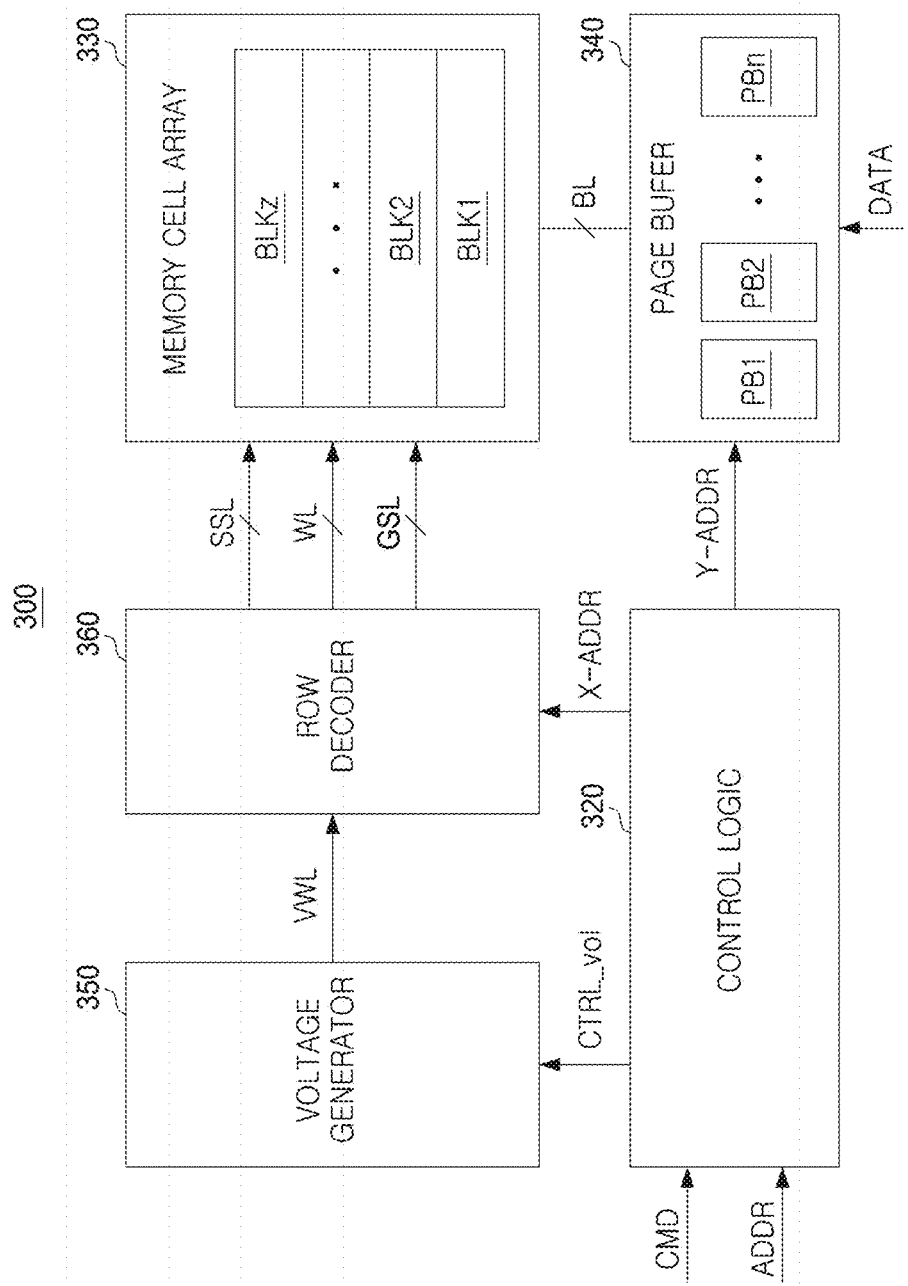
FIGS. 3 to 5 are diagrams illustrating in more detail memory blocks included in a nonvolatile memory.

FIG. 3 is an example block diagram illustrating the nonvolatile memory. Referring to FIG. 3, the nonvolatile memory 300 may include a control logic circuit 320, a memory cell array 330, a page buffer 340, a voltage generator 350, and/or a row decoder 360. Although not illustrated in FIG. 3, the nonvolatile memory 300 may further include a memory interface circuit, and may further include column logic, a pre-decoder, a temperature sensor, a command decoder, an address decoder, and the like.

The control logic circuit 320 may generally control various operations in the nonvolatile memory 300. The control logic circuit 320 may output various control signals in response to a command CMD and/or an address ADDR from the memory interface circuit. For example, the control logic circuit 320 may output a voltage control signal CTRL_vol, a row address X-ADDR, and a column address Y-ADDR.

The memory cell array 330 may include a plurality of memory blocks BLK1 to BLKz (z is a positive integer), and each of the plurality of memory blocks BLK1 to BLKz may include a plurality of memory cells. The memory cell array 330 may be connected to the page buffer 340 through bit lines BL, and connected to the row decoder 360 through word lines WL, string selection lines SSL, and ground selection lines GSL.

In example embodiments, the memory cell array 330 may include a 3-dimensional (3D) memory cell array, and the 3D memory cell array may include a plurality of NAND strings. Each NAND string may include memory cells respectively connected to word lines stacked vertically on a substrate. U.S. Pat. Nos. 7,679,133, 8,553,466, 8,654,587, 8,559,235, and U.S. Patent Application Publication No. 2011/0233648 are incorporated herein by reference in their entirety. In example embodiments, the memory cell array 330 may include a 2-dimensional (2D) memory cell array, and the 2-dimensional memory cell array may include the plurality of NAND strings arranged along row and column directions.

The page buffer 340 may include a plurality of page buffers PB1 to PBn (n is an integer greater than or equal to 3), and the plurality of page buffers PB1 to PBn may each be connected to the memory cells through a plurality of bit lines BL. The page buffer 340 may select at least one of the bit lines BL in response to a column address Y-ADDR. The page buffer 340 may operate as a write driver or a sense amplifier according to an operation mode. For example, during the programming operation, the page buffer 340 may apply a bit line voltage corresponding to data to be programmed to the selected bit line. During the read operation, the page buffer 340 may sense data stored in the memory cell by sensing a current or voltage of the selected bit line.

The voltage generator 350 may generate various types of voltages for performing program, read, and erase operations based on the voltage control signal CTRL_vol. For example, the voltage generator 350 may generate a program voltage, a read voltage, a program verify voltage, an erase voltage, or the like as a word line voltage VWL.

The row decoder 360 may select one of the plurality of word lines WL in response to the row address X-ADDR and may select one of the plurality of string selection lines SSL. For example, during the programming operation, the row decoder 360 may apply the program voltage and the program verify voltage to the selected word line, and during the read operation, apply the read voltage to the selected word line.

Figure 4:
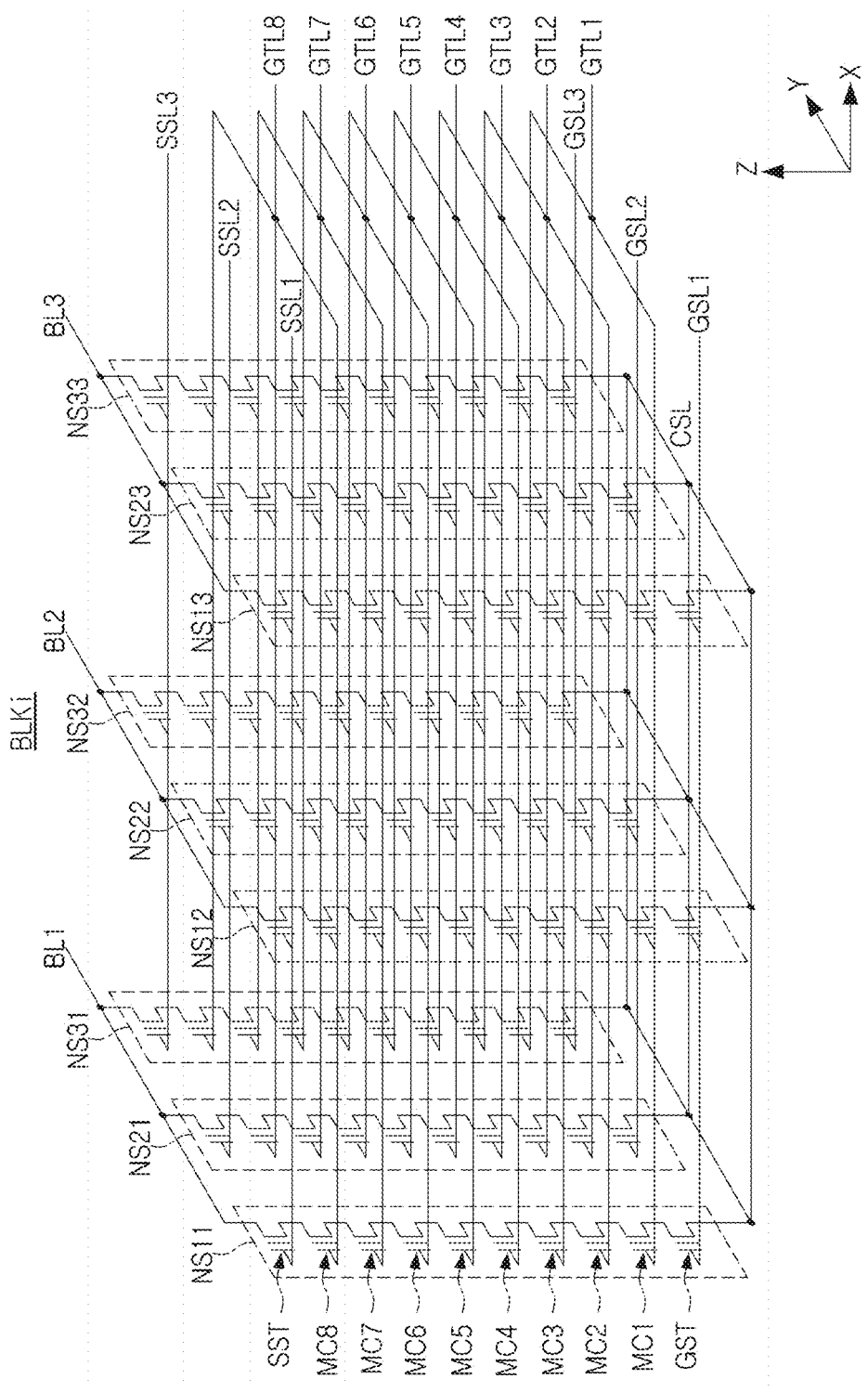

FIG. 4 is a diagram illustrating a 3D V-NAND structure that may be applied to a storage device according to example embodiments. When the nonvolatile memory of the storage device is implemented as a 3D V-NAND type flash memory, each of the plurality of memory blocks constituting the nonvolatile memory may be represented by an equivalent circuit as illustrated in FIG. 4.

A memory block BLKi illustrated in FIG. 4 represents a 3-dimensional memory block formed on a substrate in a 3-dimensional structure. For example, a plurality of memory NAND strings included in the memory block BLKi may be formed in a direction perpendicular to the substrate.

Referring to FIG. 4, the memory block BLKi may include a plurality of memory NAND strings NS11 to NS33 connected between the bit lines BL1, BL2, and BL3 and a common source line CSL. Each of the plurality of memory NAND strings NS11 to NS33 may include a string select transistor SST, a plurality of memory cells MC1, MC2, . . . , MC8, and a ground select transistor GST. FIG. 3 illustrates that each of the plurality of memory NAND strings NS11 to NS33 includes eight memory cells MC1, MC2, . . . , MC8, but example embodiments are not necessarily limited thereto.

The string select transistor SST may be connected to the corresponding string selection lines SSL1, SSL2, and SSL3. The plurality of memory cells MC1, MC2, . . . , MC8 may be connected to corresponding gate lines GTL1, GTL2, GTL8, respectively. The gate lines GTL1, GTL2, GTL8 may correspond to word lines, and some of the gate lines GTL1, GTL2, GTL8 may correspond to dummy word lines. The ground select transistor GST may be connected to the corresponding ground selection lines GSL1, GSL2, and GSL3. The string select transistor SST may be connected to the corresponding bit lines BL1, BL2, and BL3, and the ground select transistor GST may be connected to the common source line CSL.

Word lines (for example, WL1) having the same height may be connected in common, and the ground selection lines GSL1, GSL2, and GSL3 and the string selection lines SSL1, SSL2, and SSL3 may be separated from each other. FIG. 3 illustrates that the memory block BLK is connected to eight gate lines GTL1, GTL2, GTL8 and three bit lines BL1, BL2, BL3, but example embodiments are not necessarily limited thereto.

The memory block BLK may have different bit densities according to the number of bits stored in the memory cells included in the memory block BLK.

Figure 5:
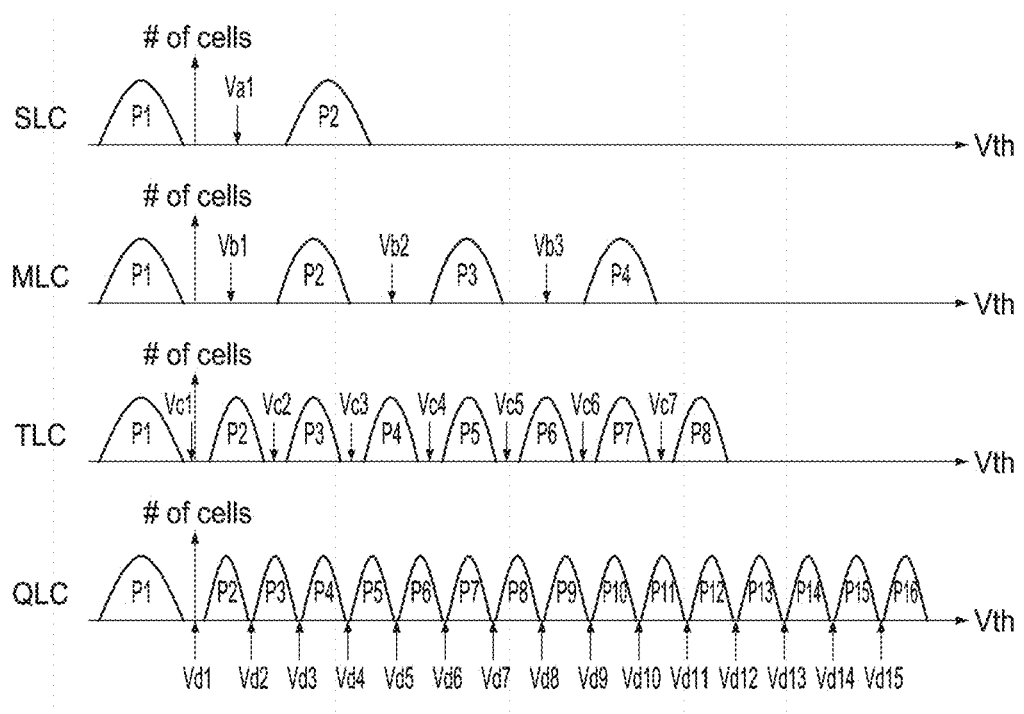

FIG. 5 is a diagram illustrating threshold voltage distributions according to the number of bits stored in the memory cell.

Referring to FIG. 5, a horizontal axis of each graph represents magnitude of a threshold voltage, and a vertical axis represents the number of memory cells.

When the memory cell is a single level cell (SLC) that stores 1-bit data, the memory cell may have a threshold voltage corresponding to any one of a first program state P1 and a second program state P2. A read voltage Va1 may be a voltage for dividing the first program state P1 and the second program state P2. Since the memory cell having the first program state P1 has a lower threshold voltage than the read voltage Va1, the memory cell may be read as an on-cell. Since the memory cell having the second program state P2 has a higher threshold voltage than the read voltage Va1, the memory cell may be read as an off cell.

When the memory cell is a multiple level cell (MLC) that stores 2-bit data, the memory cell may have a threshold voltage corresponding to any one of the first to fourth program states P1 to P4. The first to third read voltages Vb1 to Vb3 may be read voltages for dividing each of the first to fourth program states P1 to P4.

When the memory cell is a triple level cell (TLC) that stores 3-bit data, the memory cell may have a threshold voltage corresponding to any one of first to eighth program states P1 to P8. First to seventh read voltages Vc1 to Vc7 may be read voltages for dividing each of the first to eighth program states P1 to P8.

When the memory cell is a quadruple level cell (QLC) that stores 4-bit data, the memory cell may have any one of first to sixteenth program states P1 to P16. First to fifteenth read voltages Vd1 to Vd15 may be read voltages for dividing each of the first to sixteenth program states P1 to P16.

The nonvolatile memory (NVM) may perform an HSP operation to quickly program data into a multi-level memory cell. For example, when the nonvolatile memory (NVM) programs the TLC, the HSP operation may include an operation of programming 3-bit data at once by applying a program voltage, which gradually increases, to the word line using the row decoder 360 of FIG. 3 to sequentially form the first to eighth program states P1 to P8.

Hereinafter, a method of striping data in nonvolatile memories including multi-level memory cells will be described with reference to FIG. 6.

Figure 6:
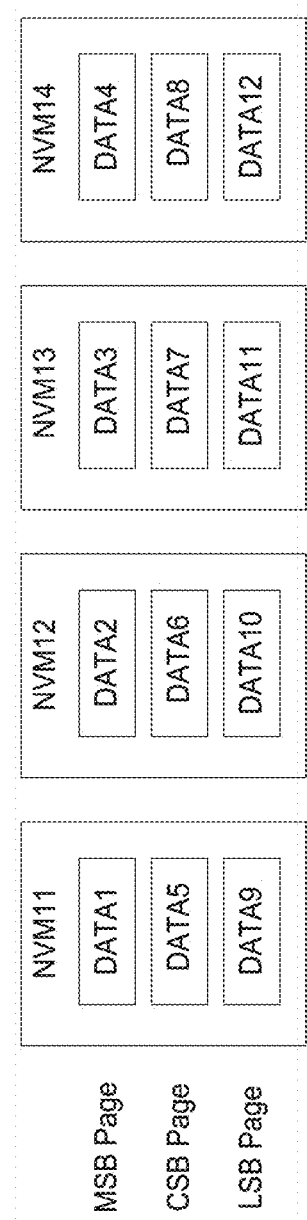
FIG. 6 is a diagram illustrating a striping operation.

FIG. 6 illustrates a page included in each of the nonvolatile memories NVM11 to NVM14. The nonvolatile memories NVM11 to NVM14 may be nonvolatile memories connected to different ways of the first channel CH1 among the plurality of nonvolatile memories NVM11 to NVMmn included in the memory device 220 described with reference to FIG. 2.

When the pages included in the nonvolatile memories NVM11 to NVM14 include the multi-level memory cells, each of the pages may be logically divided into a plurality of sub-pages. For example, when the pages include the TLC, each of the pages may be divided into a most significant bit (MSB) page, a central significant bit (CSB) page, and a least significant bit (LSB) page.

The storage controller 210 may stripe data for each sub-page of the nonvolatile memories NVM11 to NVM14. In the example of FIG. 6, data may be received from the host 100 in the order of first to twelfth data DATA1 to DATA12. The storage controller 210 may allocate the first to fourth data DATA1 to DATA4 to MSB pages of the nonvolatile memories NVM11 to NVM14, allocate the fifth to eighth data DATA5 to DATA8 to CSB pages, and allocate LSB pages to the ninth to twelfth data DATA9 to DATA12, to thereby stripe the first to twelfth data DATA1 to DATA12.

Since the first to twelfth data DATA1 to DATA12 may be programmed at once by the striping operation, the write performance of the storage device 200 may be improved. When the first to twelfth data DATA1 to DATA12 are logically continuous data, it is highly likely that the first to twelfth data DATA1 to DATA12 are sequentially read. During the read operation of the first to twelfth data DATA1 to DATA12, the continuous data from the nonvolatile memories NVM11 to NVM14 may be simultaneously read, so the read performance of the storage device 200 may also be improved.

The striping method has been described with reference to FIG. 6, for example, when the storage device 200 strips data into four nonvolatile memories NVM11 to NVM14, that is, when the striping number is "4." However, example embodiments are not limited thereto, and the striping number may be changed.

The programming size of the memory device 220 may be determined according to the striping number and the memory cell level. The nonvolatile memory (NVM) may be programmed through the HSP operation after data is allocated to all the sub-pages. In the example of FIG. 6, all of the nonvolatile memories NVM11 to NVM14 may be in a state in which the HSP operation may not be performed until the eighth data DATA8 is allocated to the sub-page, and the HSP operation may be performed after the ninth to twelfth data DATA9 to DATA12 are allocated to the LSB pages. That is, the programming size in FIG. 6 may correspond to a size of 12 sub-pages. When 32 KB data is stored in one sub-page, the programming size may be 384 KB (=32*12). As the striping number increases, the programming size may increase, and the write amplification of the nonvolatile memory may increase.

Figure 7:
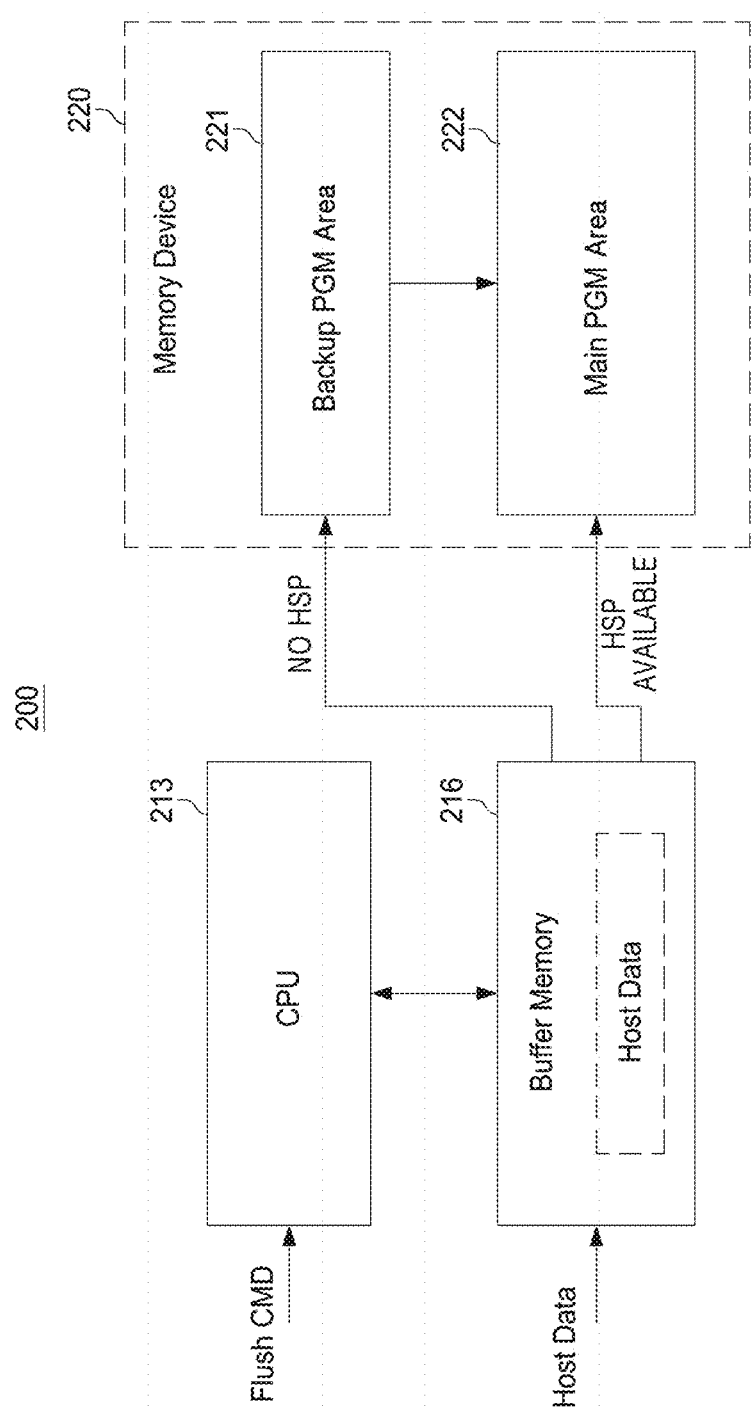
FIGS. 7 to 8B are diagrams illustrating write amplification of a nonvolatile memory according to the striping number.
Figure 8A:
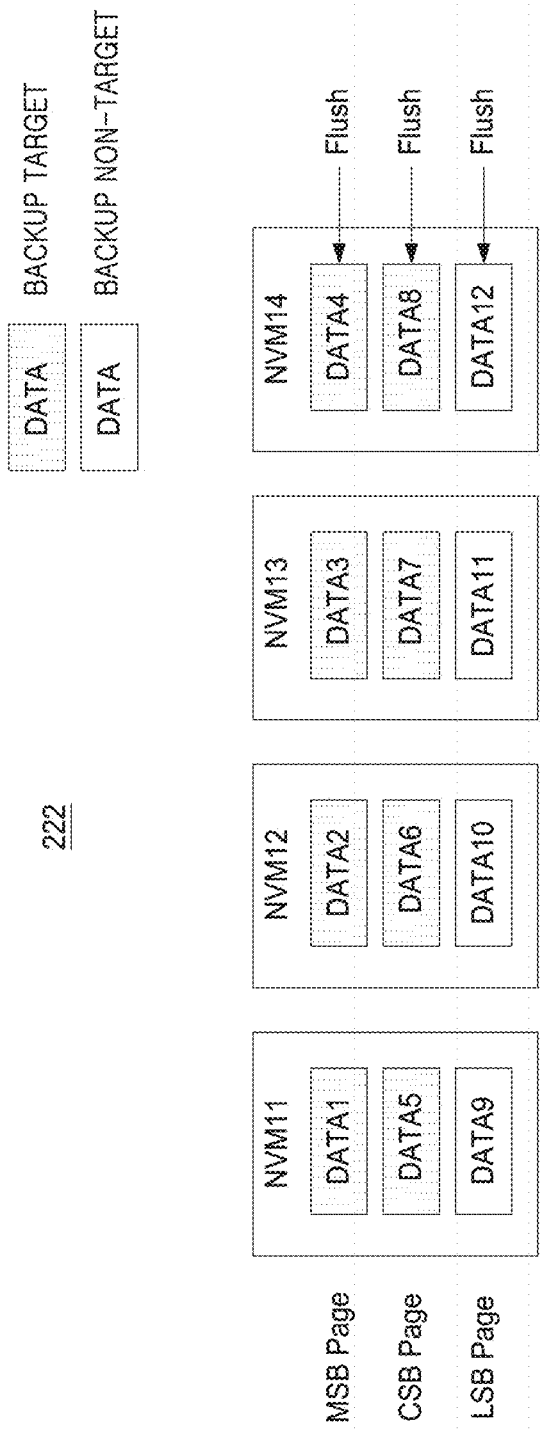
Figure 8B:
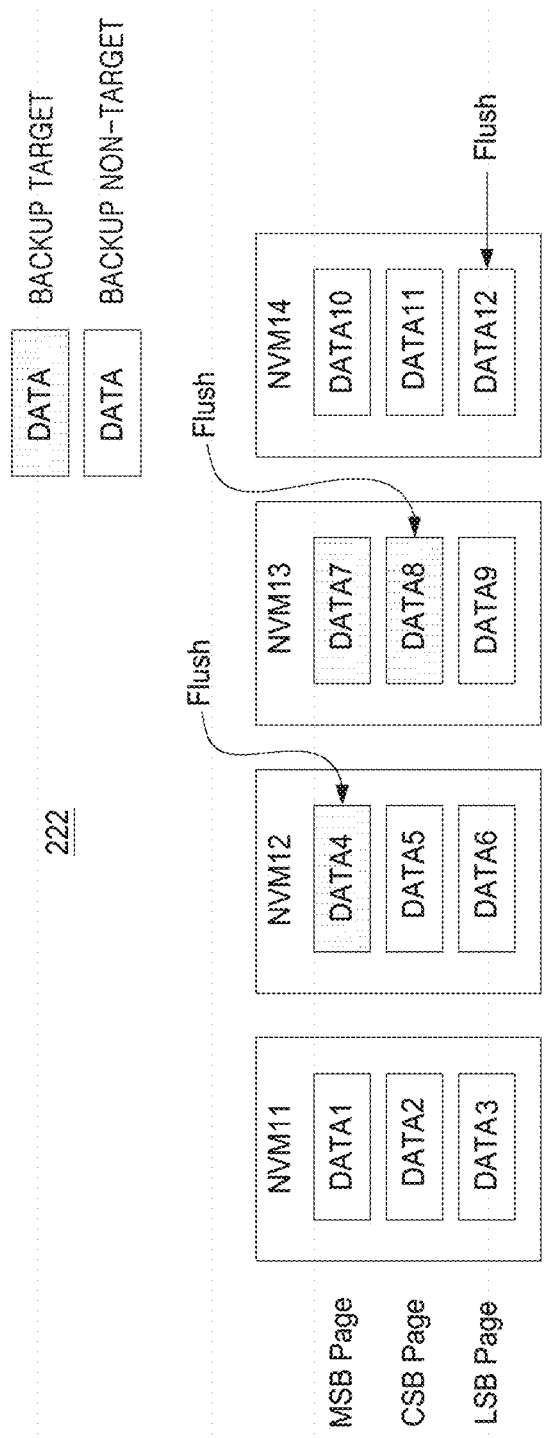

FIGS. 7 to 8B are diagrams illustrating in detail the write amplification of the nonvolatile memory according to the striping number.

FIG. 7 illustrates a CPU 213, a buffer memory 216, and a memory device 220 included in the storage device 200. The storage device 200 of FIG. 7 corresponds to the storage device 200 described with reference to FIGS. 1 and 2.

The buffer memory 216 may buffer data (host data) received from the host 100.

The CPU 213 may flush data buffered in the buffer memory 216 to the memory device 220. For example, the CPU 213 may perform the flush operation when data having a size greater than or equal to a predetermined or alternatively, desired or given size is buffered in the buffer memory 216 or when the flush command (flush CMD) is received from the host 100.

The memory device 220 may include a backup program area 221 and a main program area 222. The memory blocks included in the nonvolatile memories NVM may provide the backup program area 221 and the main program area 222.

When the size of data buffered in the buffer memory 216 is greater than or equal to the programming size, the CPU 213 may store the data of the programming size in the main program area 222.

In some example embodiments, where the size of the buffered data is smaller than the programming size when the CPU 213 performs the flush operation, the CPU 213 may temporarily program the buffered data in the backup program area 221. Then, the CPU 213 may combine data buffered later in the buffer memory 216 with the temporarily programmed data to form the data of the programming size, and then program the data in the main program area 222.

The main program area 222 may have a higher bit density than the backup program area 221. For example, the main program area 222 may include multi-level memory blocks such as TLC memory blocks, and the backup program area 221 may include SLC memory blocks. However, example embodiments are not limited thereto, and the main program area 222 and the backup program area 221 may have various bit densities.

In some example embodiments where the CPU 213 uses the backup program area 221 when performing the flush operation, data may be stored without wasting a space of the main program area 222, but the write amplification may occur due to data temporarily programmed in the backup program area 221. The larger the striping number, the more the write amplification may occur.

Hereinafter, a difference in the degree of the write amplification according to the striping number will be described with reference to FIGS. 8A and 8B, taking as an example the example embodiments in which the striping number is "4" and the example embodiments in which the striping number is "1."

FIG. 8A is a diagram illustrating the write amplification that occurs when the striping number is "4."

FIG. 8A illustrates the nonvolatile memories NVM11 to NVM14 constituting the main program area 222. As described with reference to FIG. 6, when data is received from the host 100 in the order of the first to twelfth data DATA1 to DATA12, the first to fourth data DATA1 to DATA4 may be allocated to the MSB pages of the nonvolatile memories NVM11 to NVM14, the fifth to eighth data DATA5 to DATA8 may be allocated to the CSB pages, and the ninth to twelfth data DATA9 to DATA12 may be allocated to the LSB pages.

The flush command may be periodically provided from the host 100 to the storage device 200. FIG. 8A illustrates example embodiments in which the fourth data DATA4, the eighth data DATA8, and the twelfth data DATA12 are buffered in the buffer memory 216, and then the flush commands are provided.

After the fourth data DATA4 is buffered in the buffer memory 216, sizes of the first to fourth data DATA1 to DATA4 may be smaller than the programming size. Accordingly, the storage controller 210 may provide the first to fourth data DATA1 to DATA4 to the backup program area 221 in response to the flush command.

After the eighth data DATA8 is buffered in the buffer memory 216, a size of data obtained by combining the temporarily programmed first to fourth data DATA1 to DATA4 with the fifth to eighth data DATA5 to DATA8 buffered in the buffer memory 216 may be smaller than the programming size Accordingly, the storage controller 210 may also provide the fifth to eighth data DATA5 to DATA8 to the backup program area 221 in response to the flush command.

After the twelfth data DATA12 is buffered in the buffer memory 216, a size of data obtained by combining the temporarily programmed first to eighth data DATA1 to DATA8 with the ninth to twelfth data DATA9 to DATA12 buffered in the buffer memory 216 may be the programming size. Accordingly, the storage controller 210 may combine the first to eighth data DATA1 to DATA8 with the ninth to twelfth data DATA9 to DATA12 in response to the flush command and program the combined data in the main program area 222.

In FIG. 8A, data that is programmed in the backup program area 221 and then programmed in the main program area 222 may be displayed as a "backup target." Data that is directly programmed in the main program area 222 may be displayed as a "backup non-target." The first to eighth data DATA1 to DATA8 may be programmed in the backup program area 221 as backup target data and then programmed in the main program area 222.

FIG. 8B is a diagram illustrating the write amplification that occurs when the striping size is "1."

FIG. 8B illustrates the nonvolatile memories NVM11 to NVM14 constituting the main program area 222. When the striping size is "1," the first to third data DATA1 to DATA3 among the sequentially received first to twelfth data DATA1 to DATA12 may be allocated to thee MSB, CSB, and LSB pages of the nonvolatile memory NVM11, the fourth to sixth data DATA4 to DATA6 may be allocated to the MSB, CSB, and LSB pages of the nonvolatile memory NVM12, the seventh to ninth data DATA7 to DATA9 may be allocated to the MSB, CSB, and LSB pages of the nonvolatile memory NVM13, and the tenth to twelfth data DATA10 to DATA12 may be allocated to the MSB, CSB, and LSB pages of the nonvolatile memory NVM14.

In the example of FIG. 8B, when the first to third data DATA1 to DATA3 are allocated to the MSB, CSB, and LSB pages of the nonvolatile memory NVM11, the nonvolatile memory NVM11 may perform the HSP operation. That is, when the striping size is "1," the programming size may correspond to a size of three sub-pages.

As in the example described with reference to FIG. 8A, the fourth data DATA4, the eighth data DATA8, and the twelfth data DATA12 may be buffered in the buffer memory 216, and then the flash commands may be provided. When the flush command is received from the host 100 while the first to fourth data DATA1 to DATA4 are buffered in the buffer memory 216, the first to third data DATA1 to DATA3 that satisfy the programming size may be programmed in the nonvolatile memory NVM11 of the main program area 222, and the fourth data DATA4 that does not satisfy the program size may be programmed in the backup program area 221.

In addition, when the flush command is received from the host 100 while the fifth to eighth data DATA5 to DATA8 are buffered in the buffer memory 216, the fourth data DATA4 programmed in the backup program area 221 and the fifth and sixth data DATA5 and DATA6 buffered in the buffer memory 216 may be programmed together in the nonvolatile memory NVM12 of the main program area 222, and the seventh and eighth data DATA7 and DATA8 that do not satisfy the programming size may be programmed in the backup program area 221.

When the flush command is received from the host 100 while the ninth to twelfth data DATA9 to DATA12 are buffered in the buffer memory 216, the seventh and eighth data DATA7 and DATA8 and the ninth data DATA9 programmed in the backup program area 221 may be programmed together in the nonvolatile memory NVM13 of the main program area 222, and the tenth to twelfth data DATA10 to DATA12 may be programmed in the nonvolatile memory NVM14 of the main program area 222.

In FIG. 8B, the fourth, seventh, and eighth data DATA4, DATA7, and DATA8 may be programmed in the backup program area 221 as the backup target data and then programmed in the main program area 222, and the remaining data may be directly programmed in the main program area 222 in the buffer memory 216 as the backup non-target data.

Comparing FIGS. 8A and 8B, even if the flush command is received from the host 100 at the same period, when the striping number is large, the write amplification due to the backup program may be greater.

According to example embodiments, the storage device 200 may analyze a pattern of data received from the host 100 to determine continuity of data, and adjust the striping number according to the continuity of data. When storing random data, the storage device 200 may reduce the striping number to alleviate the write amplification, and when storing the continuous data, the storage device 200 may increase the striping number to improve the read performance of the continuous data.

Figure 9:
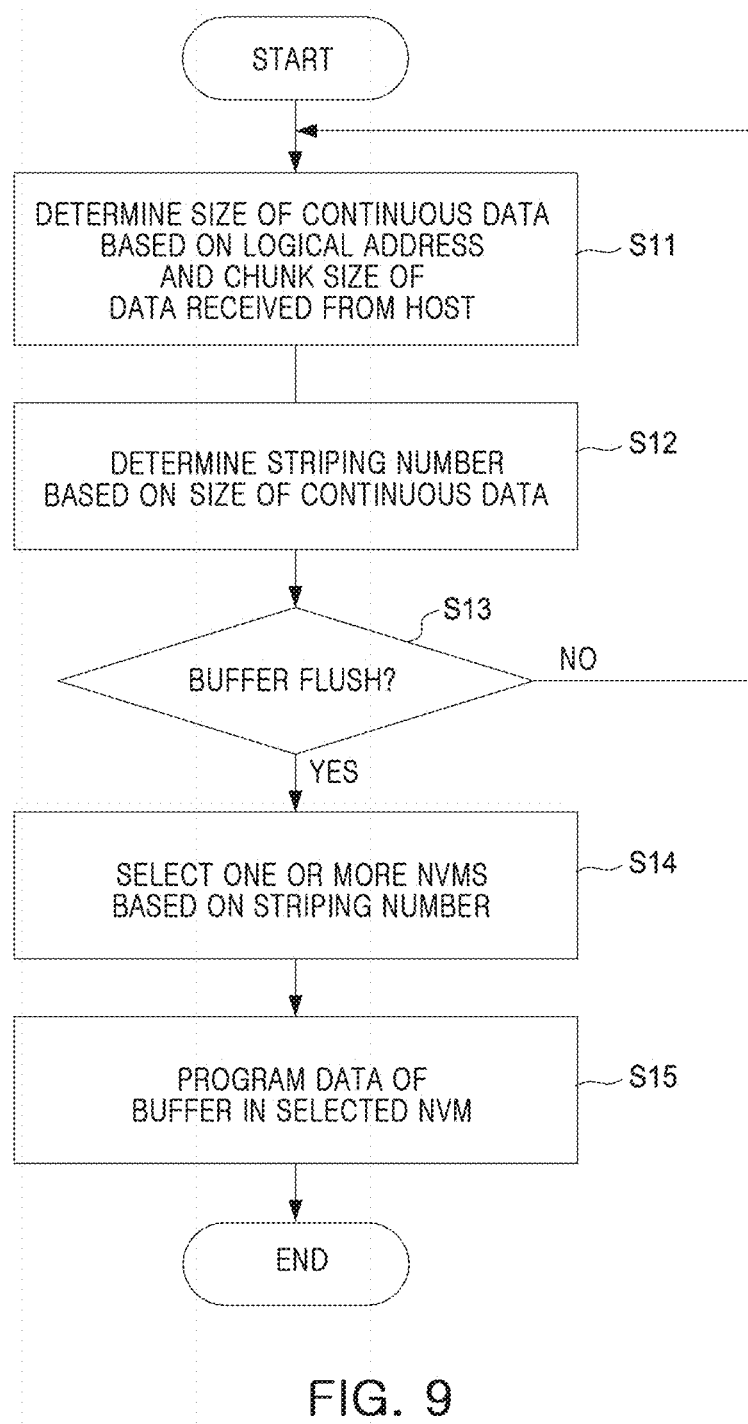
FIG. 9 is a flowchart illustrating an operation of the storage device according to example embodiments.

Hereinafter, example embodiments will be described in detail with reference to FIG. 9 is a flowchart illustrating an operation of the storage device according to example embodiments.

In operation S11, the storage device 200 may determine the size of continuous data based on the logical address and the chunk size of the data chunk received from the host 100.

A specific method of determining, by a storage device 200, to determine a size of the continuous data will be described later with reference to FIG. 10.

In operation S12, the storage device 200 may determine the striping number based on the size of continuous data. For example, the storage device 200 may increase the striping number as the size of continuous data increases.

In operation S13, the storage device 200 may determine whether to flush the data buffered in the buffer memory 216 to the memory device 220. For example, the storage device 200 may determine to flush data when the data buffered in the buffer memory 216 is greater than or equal to the predetermined or alternatively, desired or given size or when the flush command is received from the host 100.

When the storage device 200 determines not to flush data (NO in operation S13), the storage device 200 returns to operation S11 to receive data from the host 100, and further buffers the data in the buffer memory 216.

When the storage device 200 determines to flush data (YES in operation S13), the storage device 200 may select one or more nonvolatile memories (NVMs) into which data is to be programmed based on the determined striping number in operation S14.

In operation S15, the storage device 200 may store the data of the buffer memory 216 in the one or more selected nonvolatile memories (NVM).

The one or more selected nonvolatile memories (NVM) may perform the programming operation in parallel to store the data of the buffer memory 216.

Figure 10:
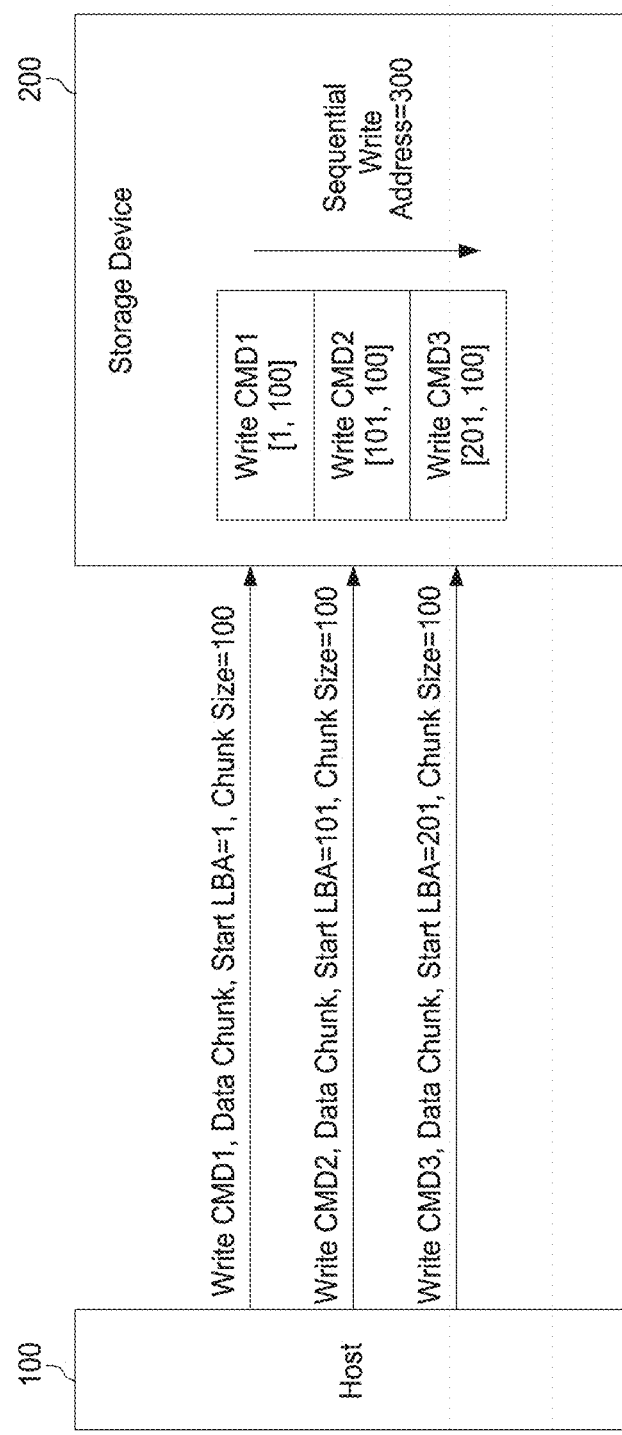
FIG. 10 is a diagram illustrating a method of analyzing, by a storage device, a pattern of data received from a host.

FIG. 10 is a diagram illustrating a method of determining, by a storage device, a pattern of data received from a host.

The host 100 and the storage device 200 illustrated in FIG. 10 correspond to the host 100 and the storage device 200 described with reference to FIGS. 1 and 2.

The host 100 may divide continuous data having continuous logical addresses into data chunks of a predetermined or alternatively, desired or given size and provide the divided data to the storage device 200. For example, in order to transmit data having 300 continuous logical addresses from LBA1 to LBA300, the host 100 may divide the data into data chunks corresponding to LBA1 to LBA100, data chunks corresponding to LBA101 to LBA200, and data chunks corresponding to LBA201 to LBA300.

The host 100 may provide write commands for each of the divided data chunks to the storage device 200. The host 100 may provide a data chunk, a start logical address, and/or a chunk size together with the write command. The start logical address may refer to a first logical address among the continuous logical addresses of the data chunk. The chunk size may refer to the size of the data chunk, and in the example of FIG. 10, the chunk size may be expressed as the number of continuous logical addresses.

In the example of FIG. 10, the host 100 may provide a first write command (write CMD1), a data chunk, a start logical address "1," and a chunk size "100" to the storage device 200 in order to request to write the data chunk corresponding to LBA1 to LBA100. Similarly, the host 100 may provide a second write command (write CMD2), a data chunk, a start logical address "101," and a chunk size "100" to the storage device 200 in order to request to write data chunks corresponding to LBA101 to LBA200, and may provide a third write command (write CMD3), a data chunk, a start logical address "201," and a chunk size "100" to the storage device 200 in order to request to write data chunks corresponding to LBA201 to LBA300.

The storage device 200 may determine whether the data chunks are continuous data chunks based on start logical addresses and chunk sizes received together with the data chunks from the host 100. For example, the storage device 200 may receive the first write command from the host 100 and then receive the second write command. The storage device 200 may determine that a last logical address of the data chunk is "100" based on the start logical address "1" and the chunk size "100" of the first write command, and determine that the data chunks received together with the first and second write commands are continuous to each other based on the start logical address "101" of the second write command. Similarly, the storage device 200 may receive a third write command following the second write command. The storage device 200 may determine that a last logical address of the second write command is "200," and determine that the data chunks received together with the second and third write commands are continuous to each other based on the start logical address "201" of the third write command.

The storage device 200 may determine that 300 logical addresses are continuous over three write commands. The storage device 200 may determine the size of continuous data based on the number of continuous logical addresses. For example, when one logical address is allocated to 4 KB data, when 300 logical addresses are continuous, the size of continuous data may be determined to be "1200 KB."

When a start logical address of a currently received data chunk and a last logical address of a preceding data chunk are not continuous, the storage device 200 may determine a chunk size of the currently received data chunk as the size of continuous data.

An example of the method of determining, by a storage device 200, the striping number based on the size of continuous data and programming data in nonvolatile memories (NVM) based on the determined striping number will be described with reference to FIGS. 11 to 14.

Figure 11:
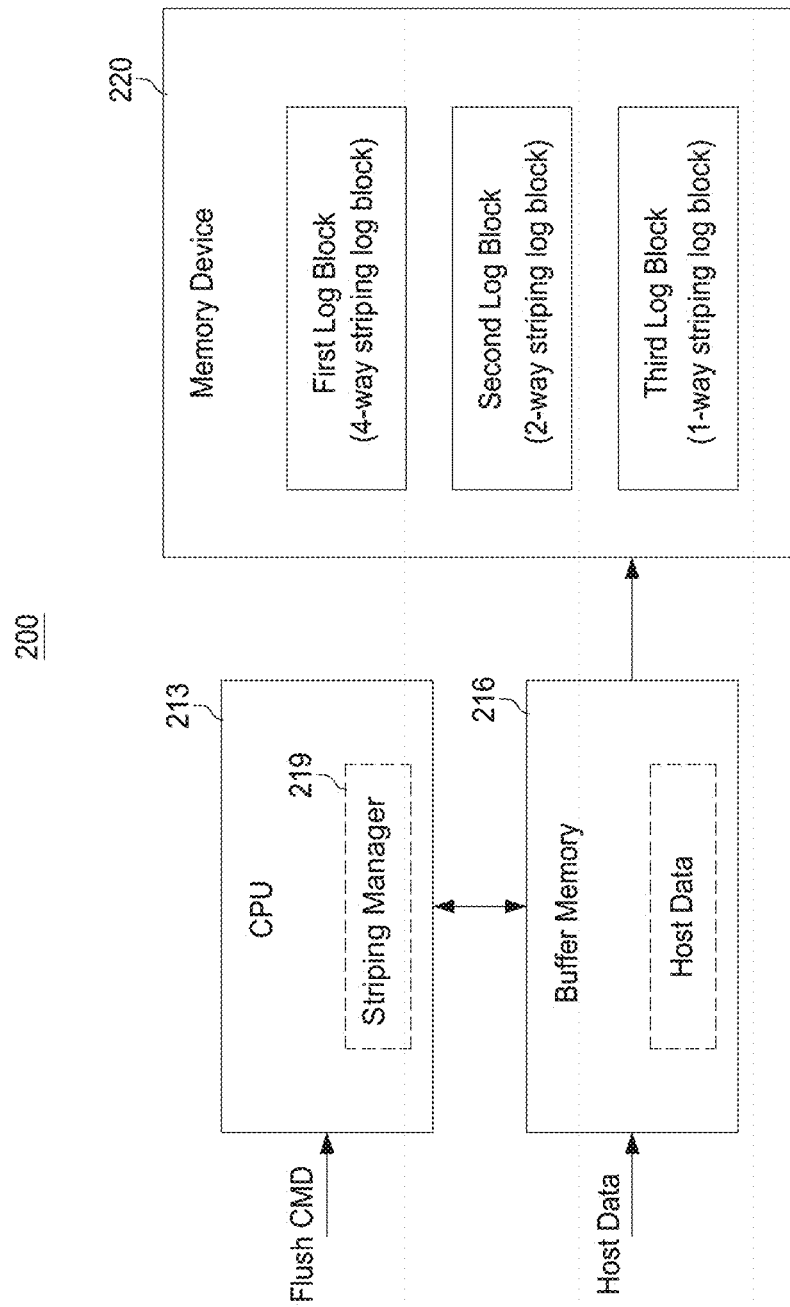
FIGS. 11 and 12C are diagrams illustrating a method of striping data according to a first example embodiment of the inventive concepts.
Figure 12A:
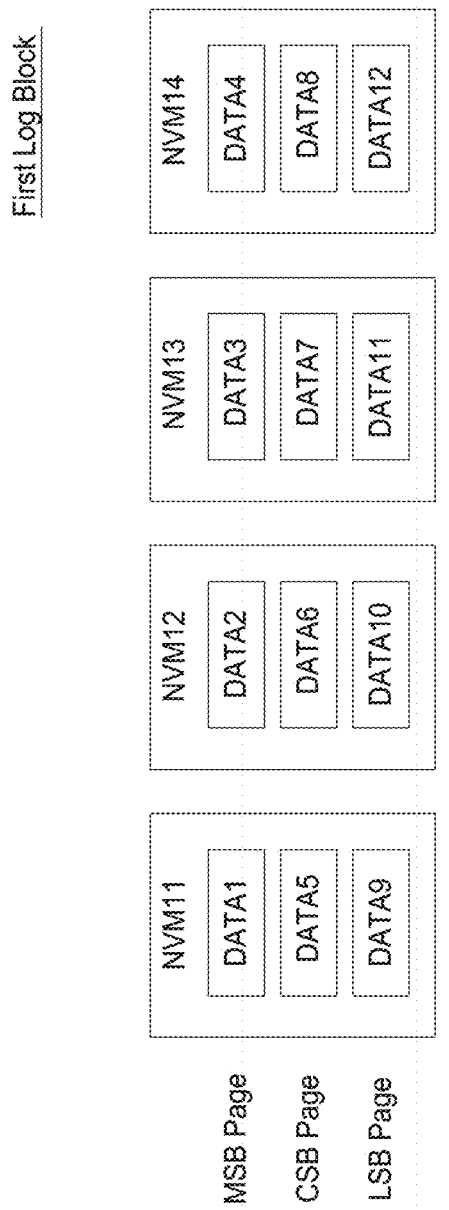
Figure 12B:
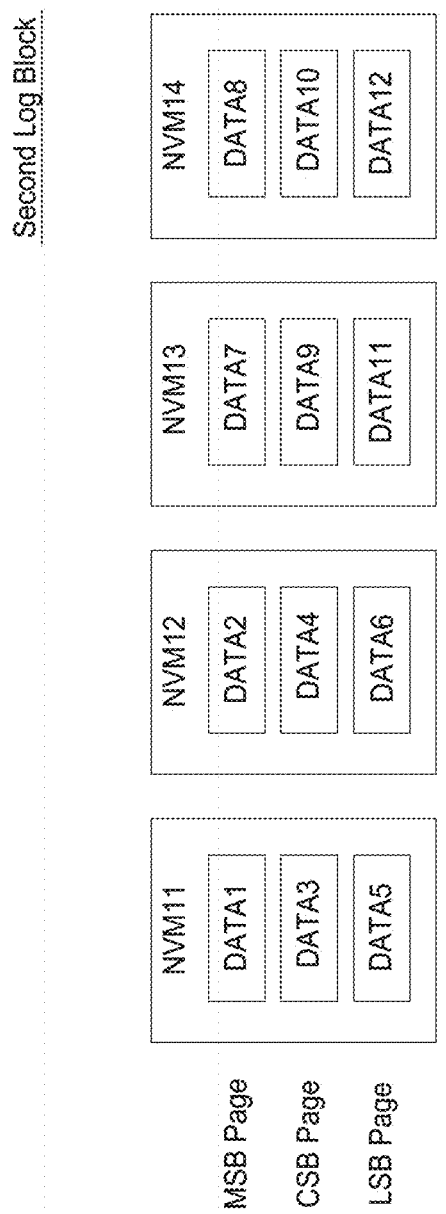
Figure 12C:
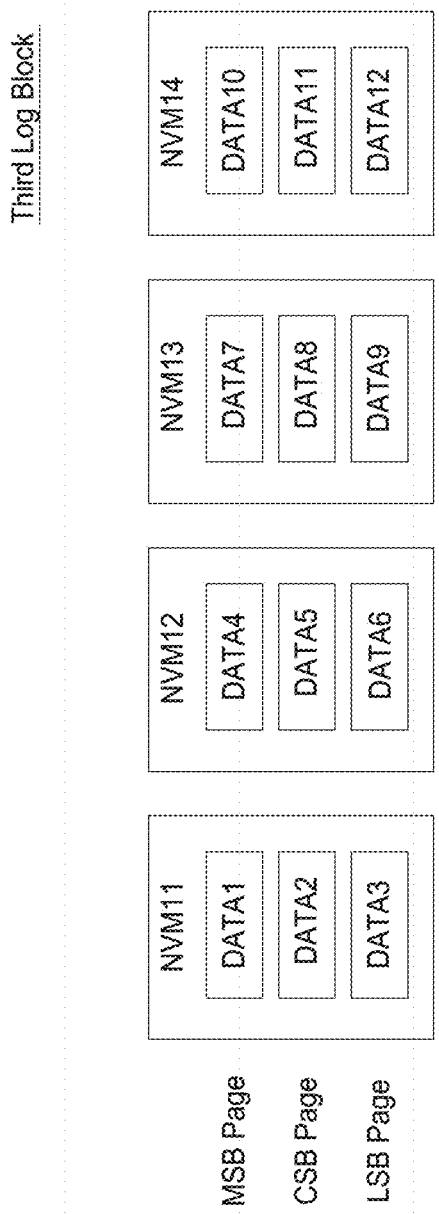

FIGS. 11 and 12C are diagrams illustrating a method of striping data according to a first example embodiment of the inventive concepts.

FIG. 11 is a diagram illustrating an operation of the storage device 200 according to the first example embodiment of the inventive concepts.

FIG. 11 illustrates the CPU 213, the buffer memory 216, and/or the memory device 220.

The buffer memory 216 may buffer the host data received from the host 100.

The CPU 213 may include a striping manager 219. The striping manager 219 may determine the striping number based on the size of continuous data. The striping manager 219 may provide the candidate striping number so that the memory device 220 may program data according to the number of various stripings. In the example of FIG. 11, the striping number may be selected from among the candidate striping number "4," "2," and "1."

According to the first example embodiment of the inventive concepts, the CPU 213 may allocate log blocks for each selectable striping number, and determine a log block into which data is to be programmed according to the striping number determined based on the size of continuous data.

The memory blocks of the nonvolatile memory (NVM) may include log blocks and data blocks. The log block may be a memory block in which address mapping is performed in units of pages, and the data block may be a memory block in which address mapping is performed in units of memory blocks. Data provided from the buffer memory 216 may first be programmed in the log block. The data programmed in the log block can be merged into the data block.

In the example of FIG. 11, the memory device 220 may include three log blocks. The striping number of a first log block may be "4," the striping number of a second log block may be "2," and the striping number of a third log block may be "1."

According to example embodiments, the striping number may be selected from among the candidate striping number according to a result of comparing a value obtained by dividing the size of continuous data by a size of a sub-page with the candidate striping number.

For example, the candidate striping number may be "1," "2," and "4," and the size of the sub-page may be "32 KB." When the size of continuous data is less than or equal to "32 KB," a value obtained by dividing the size of continuous data by the size of the sub-page may be less than or equal to "1," and the striping number may be determined to be "1." When the size of continuous data is greater than "32 KB" and less than or equal to "64 KB," the value obtained by dividing the size of continuous data by the size of the sub-page may be greater than "1" and less than or equal to "2," and the striping number may be determined to be "2." When the size of continuous data is greater than "64 KB," the value obtained by dividing the size of continuous data by the size of the sub-page may be greater than "2," and the striping number may be determined to be "4."

FIGS. 12A to 12C are diagrams illustrating a method of striping data in first to third log blocks. All of the first to third log blocks may include memory blocks allocated one by one from the nonvolatile memories NVM11 to NVM14. However, the striping number of the first to third log blocks may be different.

The striping number of the first log block illustrated in FIG. 12A may be "4." As described with reference to FIG. 6, data in the first log block may be allocated over the nonvolatile memories NVM11 to NVM14.

The striping number of the second log block illustrated in FIG. 12B may be "2." In the example of FIG. 12B, the first to sixth data DATA1 to DATA6 may be first stripped from the nonvolatile memories NVM11 and NVM12, and the seventh to twelfth data DATA7 to DATA12 may be stripped from the nonvolatile memories NVM13 and NVM14.

The striping number of the third log block illustrated in FIG. 12C may be "1." As described with reference to FIG. 8B, the first to third data DATA1 to DATA3 may be allocated to the nonvolatile memory NVM11, the fourth to sixth data DATA4 to DATA6 may be allocated to the nonvolatile memory NVM12, the seventh to ninth data DATA7 to DATA9 may be allocated to the nonvolatile memory NVM13, and the tenth to twelfth data DATA10 to DATA12 may be allocated to the nonvolatile memory NVM14.

According to example embodiments, the memory block into which the data buffered in the buffer memory 216 is to be programmed may be selected from among the first to third log blocks according to the determined striping number.

In FIGS. 11 to 12C, example embodiments where the candidate striping number is "1," "2," and "4" has been described as an example, but example embodiments are not limited thereto. For example, when eight nonvolatile memories (NVMs) are connected to one channel, the candidate striping number of "1," "2," "4," and '8' may be supported. Of course, the number of nonvolatile memories (NVM) connected to one channel and the candidate striping number is not limited to a power of two.

Figure 13:
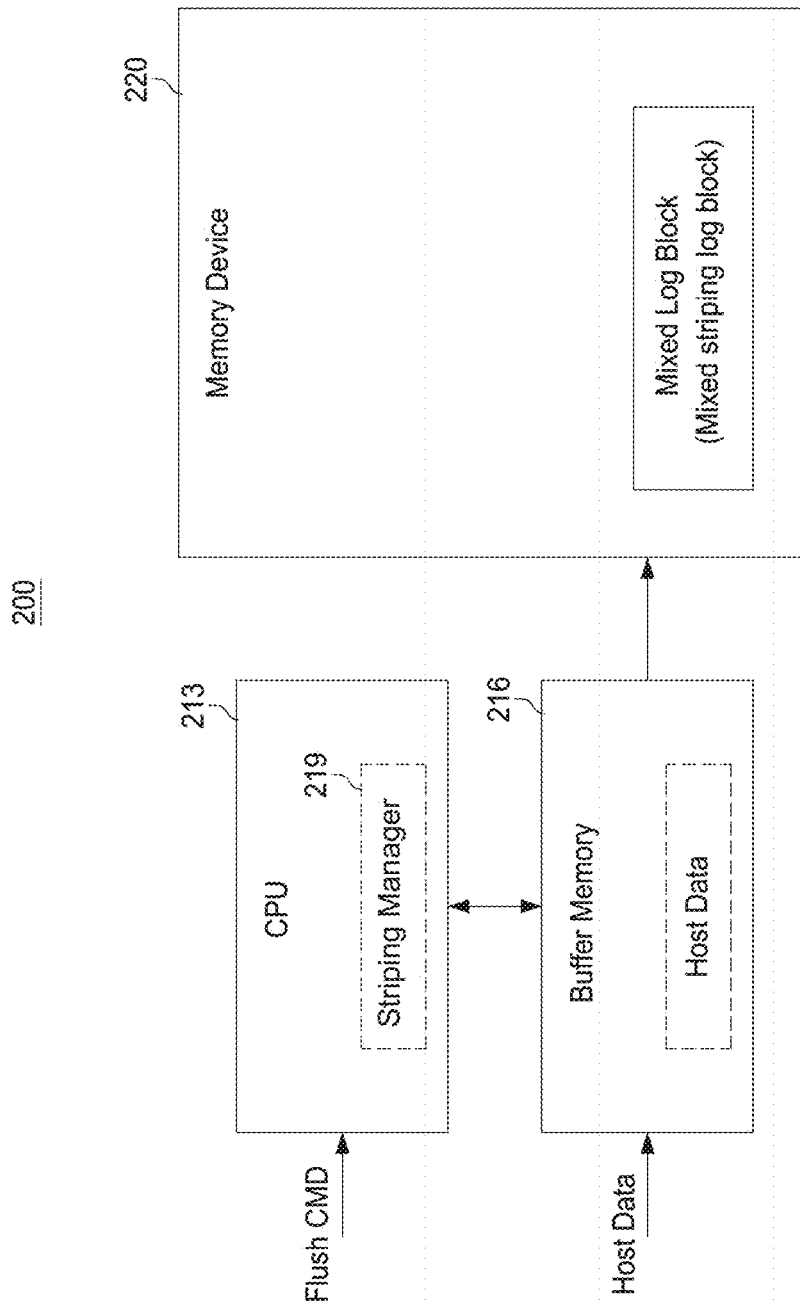
FIGS. 13 and 14 are diagrams illustrating a method of striping data according to a second example embodiment of the inventive concepts.
Figure 14:
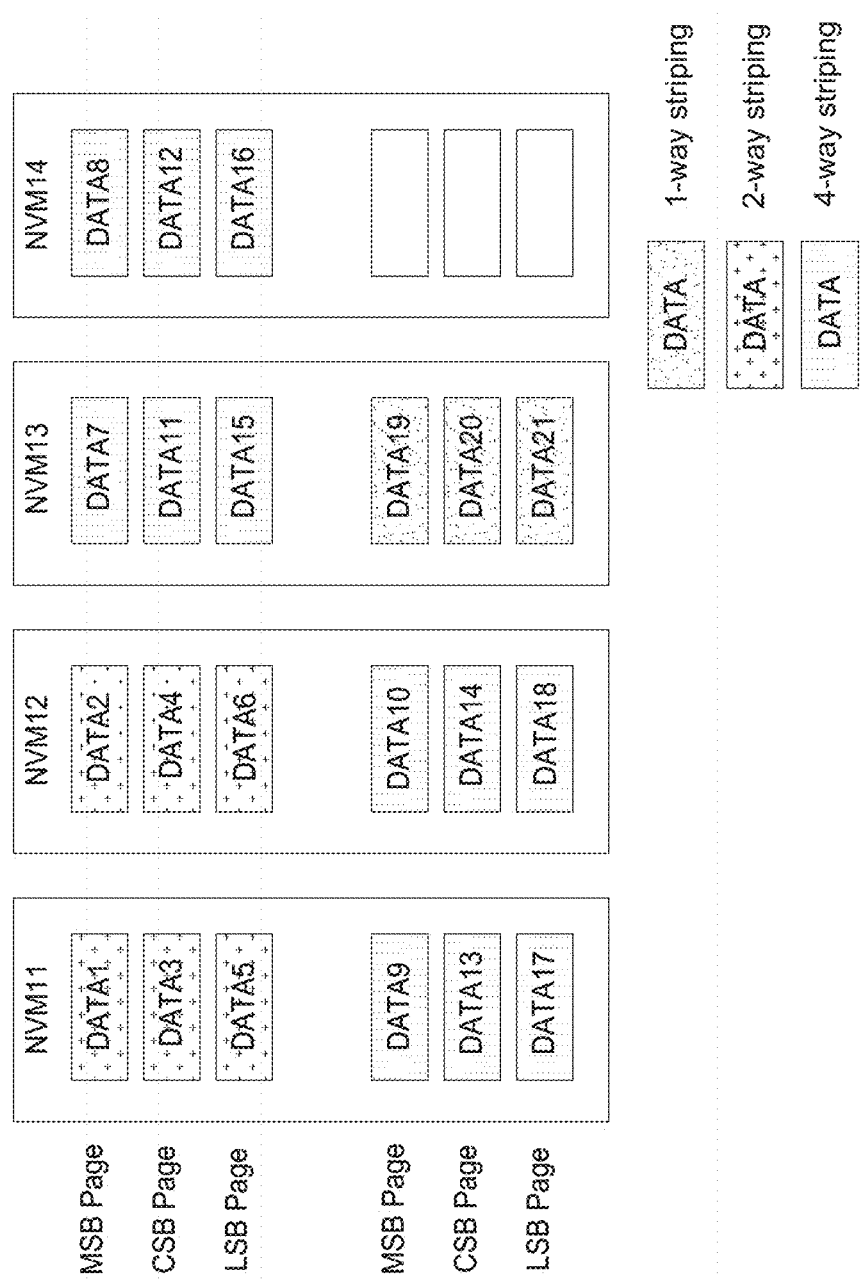

FIGS. 13 and 14 are diagrams illustrating a method of striping data according to a second example embodiment of the inventive concepts.

FIG. 13 illustrates the CPU 213, the buffer memory 216, and/or the memory device 220.

The CPU 213 may include the striping manager 219. Similar to that described with reference to FIG. 11, the striping manager 219 may determine the striping number based on the size of continuous data. Then, the striping manager 219 may select the striping number from among the candidate striping number "4," "2," and "1."

According to the second example embodiment, the CPU 213 may select the log block into which data is to be programmed, and may vary the striping number of the log block according to the striping number determined based on the size of continuous data. According to the second example embodiment, the log block in which data having the number of various stripings may be programmed may be referred to as a mixed log block.

FIG. 14 is a diagram illustrating a method in which data is stripped by the number of various stripings in the mixed log block according to the second example embodiment.

FIG. 14 illustrates pages included in the mixed log block. The mixed log block may include memory blocks allocated one by one from the nonvolatile memories NVM11 to NVM14. FIG. 14 exemplifies example embodiments in which data is received from the host 100 in the order of the first to twenty-first data DATA1 to DATA21.

When the striping number for the first to sixth data DATA1 to DATA6 is determined to be "2," the nonvolatile memories NVM11 to NVM12 may be selected to store the first to sixth data DATA1 to DATA6.

When the striping number for the seventh to eighteenth data DATA7 to DATA18 is determined to be "4," the seventh to eighteenth data DATA7 to DATA18 may be stored in a log block in which the first to sixth data DATA1 to DATA6 are stored, and the nonvolatile memories NVM11 to NVM14 may be selected to store the seventh to eighteenth data DATA7 to DATA18.

The striping number for the nineteenth to twenty-first data DATA19 to DATA21 may be determined to be "1." The nineteenth to twenty-first data DATA19 to DATA21 may be stored following the seventh to eighteenth data DATA7 to DATA18, and the nonvolatile memory NVM13 may be selected to store the nineteenth to twenty-first data DATA19 to DATA21.

According to example embodiments, the striping number of data may vary, and the data having the number of various stripings may be continuously programmed in one log block.

According to example embodiments, the storage device 200 may analyze the pattern of data received from the host 100, determine the striping number according to the continuity of data, and stripe data to one or more nonvolatile memories according to the determined striping number. According to example embodiments, the write amplification of the storage device 200 may be reduced, and the read performance of continuous data may be improved.

Hereinafter, a structure of a memory device to which example embodiments may be applied and an example of a system to which example embodiments may be applied will be described with reference to FIGS. 15 to 16.

Figure 15:
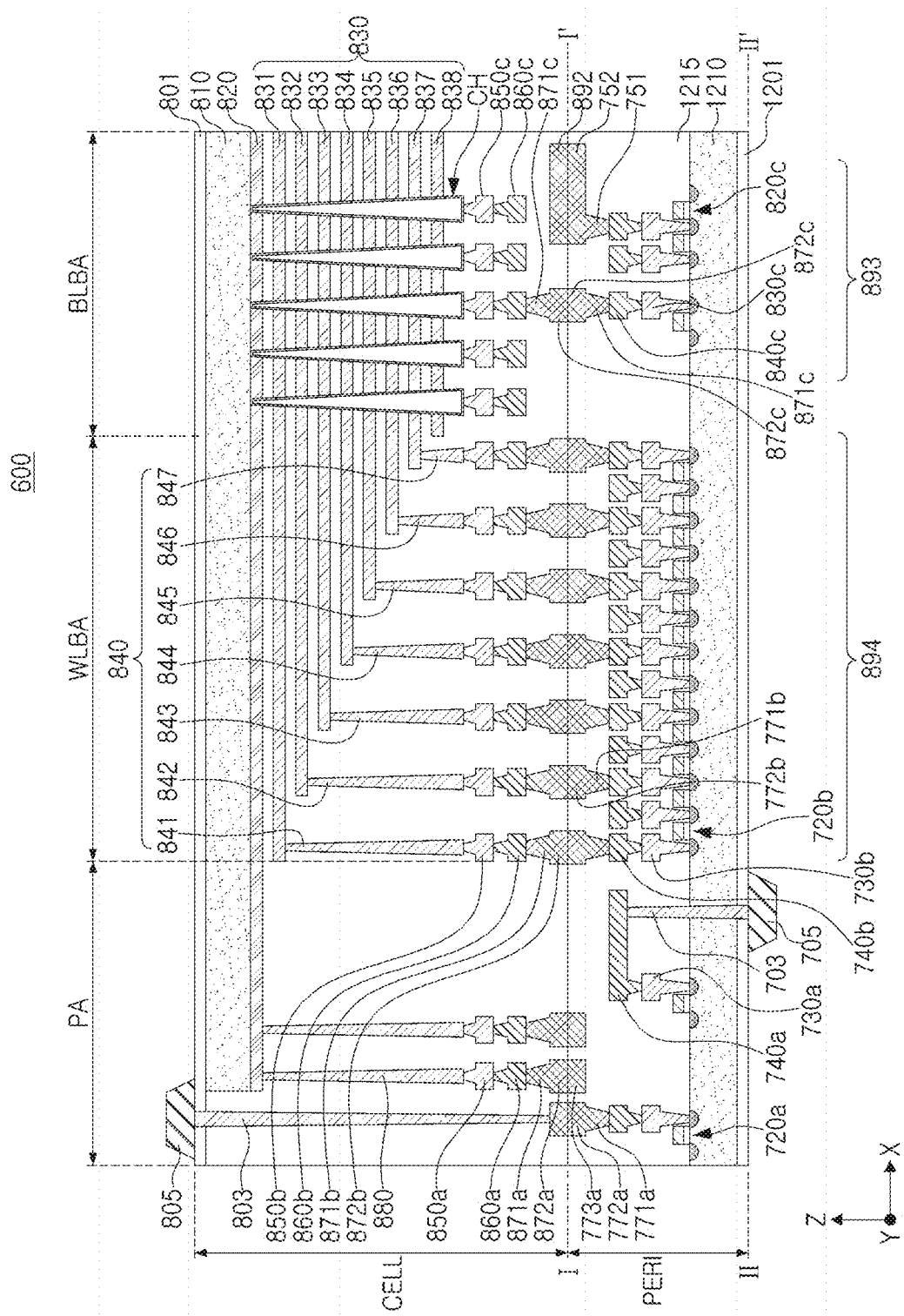
FIG. 15 is a cross-sectional view illustrating a memory device according to example embodiments.

FIG. 15 is a cross-sectional view illustrating a memory device according to example embodiments.

Referring to FIG. 15, a nonvolatile memory 600 may have a chip to chip (C2C) structure. The C2C structure may mean that an upper chip including a cell area CELL is fabricated on a first wafer, a lower chip including a peripheral circuit area PERI is fabricated on a second wafer different from the first wafer, and then the upper chip and the lower chip are connected to each other by a bonding method. For example, the bonding method may refer to a method of electrically connecting bonding metal formed in an uppermost metal layer of the upper chip and bonding metal formed in an uppermost metal layer of the lower chip to each other. For example, when the bonding metal is formed of copper (Cu), the bonding method may be a Cu—Cu bonding method, and the bonding metal may be formed of aluminum or tungsten.

Each of the peripheral circuit area PERI and the cell area CELL of the nonvolatile memory 600 may include an external pad bonding area PA, a word line bonding area WLBA, and a bit line bonding area BLBA. The peripheral circuit area PERI may include a first substrate 710, an interlayer insulating layer 715, a plurality of circuit elements 720a, 720b, and 720c formed on the first substrate 710, first metal layers 730a, 730b, and 730c connected to each of the plurality of circuit elements 720a, 720b, and 720c, and second metal layers 740a, 740b, and 740c formed on the first metal layers 730a, 730b, and 730c. In example embodiments, the first metal layers 730a, 730b, and 730c may be formed of tungsten having a relatively high resistance, and the second metal layers 740a, 740b, and 740c may be formed of copper having a relatively low resistance.

In the present specification, only the first metal layers 730a, 730b, and 730c and the second metal layers 740a, 740b, and 740c are illustrated and described, but example embodiments are not limited thereto, and at least one or more metal layers may be further formed on the second metal layers 740a, 740b, and 740c. At least some of the one or more metal layers formed on upper portions of the second metal layers 740a, 740b, and 740c may be formed of aluminum or the like having a lower resistance than copper forming the second metal layers 740a, 740b, and 740c.

The interlayer insulating layer 715 may be disposed on a first substrate 710 to cover the plurality of circuit elements 720a, 720b, and 720c, the first metal layers 730a, 730b, and 730c, and the second metal layers 740a, 740b, and 740c, and may include an insulating material such as silicon oxide, silicon nitride, or the like.

Lower bonding metals 771b and 772b may be formed on the second metal layer 740b of the word line bonding area WLBA. In the word line bonding area WLBA, the lower bonding metals 771b and 772b of the peripheral circuit area PERI may be electrically connected to upper bonding metals 871b and 872b of the cell area CELL by the bonding method, and the lower bonding metals 771b and 772b and the upper bonding metals 871b and 872b may be formed of aluminum, copper, tungsten, or the like. The upper bonding metals 871b and 872b of the cell area CELL may be referred to as first metal pads, and the lower bonding metals 771b and 772b of the peripheral circuit area PERI may be referred to as second metal pads.

The cell area CELL may provide at least one memory block. The cell area CELL may include a second substrate 810 and a common source line 820. A plurality of word lines 831 to 838 (830) may be stacked on the second substrate 810 in a direction (Z-axis direction) perpendicular to an upper surface of the second substrate 810. The string selection lines and the ground selection line may be disposed on upper portions and lower portions the word lines 830, respectively, and the plurality of word lines 830 may be disposed between the string selection lines and the ground selection line.

In the bit line bonding area BLBA, the channel structure CH may extend in the direction perpendicular to the upper surface of the second substrate 810 to penetrate through the word lines 830, the string selection lines, and the ground selection line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In example embodiments, the bit line may extend along a first direction (Y-axis direction) parallel to the upper surface of the second substrate 810.

In example embodiments illustrated in FIG. 15, an area in which the channel structure CH, the bit line, and the like are disposed may be defined as the bit line bonding area BLBA. The bit line may be electrically connected to the circuit elements 720c providing a page buffer 893 in the peripheral circuit area PERI in the bit line bonding area BLBA. As an example, the bit line may be connected to upper bonding metals 871c and 872c in the peripheral circuit area PERI, and the upper bonding metals 871c and 872c may be connected to the lower bonding metals 771c and 772c connected to the circuit elements 720c of the page buffer 893.

In the word line bonding area WLBA, the word lines 830 may extend along a second direction (X-axis direction) parallel to the upper surface of the second substrate 810, and may be connected to a plurality of cell contact plugs 841 to 847 (840). The word lines 830 and the cell contact plugs 840 may be connected to each other through pads provided by making at least some of the word lines 830 extend to different lengths along the second direction (X-axis direction). A first metal layer 850b and a second metal layer 860b may be sequentially connected to upper portions of the cell contact plugs 840 connected to the word lines 830. The cell contact plugs 840 may be connected to the peripheral circuit area PERI through the upper bonding metals 871b and 872b of the cell area CELL and the lower bonding metals 771b and 772b of the peripheral circuit area PERI in the word line bonding area WLBA.

The cell contact plugs 840 may be electrically connected to the circuit elements 720b providing a row decoder 894 in the peripheral circuit area PERI. In example embodiments, an operating voltage of the circuit elements 720b providing the row decoder 894 may be different from an operating voltage of the circuit elements 720c providing the page buffer 893. For example, the operating voltage of the circuit elements 720c providing the page buffer 893 may be greater than the operating voltage of the circuit elements 720b providing the row decoder 894.

A common source line contact plug 880 may be disposed in the external pad bonding area PA. The common source line contact plug 880 may be formed of metal, a metal compound, or a conductive material such as polysilicon, and may be electrically connected to the common source line 820. A first metal layer 850a and a second metal layer 860a may be sequentially stacked on an upper portion of the common source line contact plug 880. For example, an area in which the common source line contact plug 880, the first metal layer 850a, and the second metal layer 860a are disposed may be defined as the external pad bonding area PA.

Input/output pads 705 and 805 may be disposed in the external pad bonding area PA. Referring to FIG. 15, a lower insulating layer 701 covering a lower surface of the first substrate 710 may be formed under the first substrate 710, and a first input/output pad 705 may be formed on the lower insulating layer 701. The first input/output pad 705 may be connected to at least one of the plurality of circuit elements 720a, 720b, and 720c disposed in the peripheral circuit area PERI through the first input/output contact plug 703 and may be separated from the first substrate 710 by the lower insulating layer 701. In addition, a side insulating layer may be disposed between the first input/output contact plug 703 and the first substrate 710 to electrically separate the first input/output contact plug 703 from the first substrate 710.

Referring to FIG. 15, an upper insulating film 801 covering the upper surface of the second substrate 810 may be formed on the second substrate 810, and the second input/output pad 805 may be disposed on the upper insulating film 801. The second input/output pad 805 may be connected to at least one of the plurality of circuit elements 720a, 720b, and 720c disposed in the peripheral circuit area PERI through the second input/output contact plug 803.

According to example embodiments, the second substrate 810, the common source line 820, and the like may not be disposed in the area in which the second input/output contact plug 803 is disposed. In addition, the second input/output pad 805 may not overlap the word lines 830 in a third direction (Z-axis direction). Referring to FIG. 14, the second input/output contact plug 803 may be separated from the second substrate 810 in a direction parallel to the upper surface of the second substrate 810, and may be connected to the second input/output pad 805 by penetrating through an interlayer insulating layer 815 of the cell area CELL.

According to example embodiments, the first input/output pad 705 and the second input/output pad 805 may be selectively formed. For example, the nonvolatile memory 600 may include only the first input/output pad 705 disposed on the first substrate 710, or the second input/output pad 805 disposed on the second substrate 810 may include only the second input/output pad 850. Alternatively, the nonvolatile memory 600 may include both the first input/output pad 705 and the second input/output pad 805.

In each of the external pad bonding area PA and the bit line bonding area BLBA included in each of the cell area CELL and the peripheral circuit area PERI, the metal pattern of the uppermost metal layer exists as a dummy pattern or the uppermost metal layer may be empty.

In the external pad bonding area PA of nonvolatile memory 600, the lower metal pattern 773a having the same shape as the upper metal pattern 872a of the cell area CELL may be formed on the uppermost metal layer of the peripheral circuit area PERI to correspond to the upper metal pattern 872a formed on the uppermost metal layer of the cell area CELL The lower metal pattern 773a formed on the uppermost metal layer of the peripheral circuit area PERI may not be connected to a separate contact in the peripheral circuit area PERI. Similarly, in the external pad bonding area PA, the upper metal pattern having the same shape as the lower metal pattern of the peripheral circuit area PERI may be formed on the upper metal layer of the cell area CELL to correspond to the lower metal pattern formed the uppermost metal layer of the peripheral circuit area PERI.

The lower bonding metals 771b and 772b may be formed on the second metal layer 740b of the word line bonding area WLBA. In the word line bonding area WLBA, the lower bonding metals 771b and 772b of the peripheral circuit area PERI may be electrically connected to the upper bonding metals 871b and 872b of the cell area CELL by the bonding method.

In addition, in the bit line bonding area BLBA, the upper metal pattern 892 having the same shape as the lower metal pattern 752 of the peripheral circuit area PERI may be formed on the uppermost metal layer of the cell area CELL to correspond to the lower metal pattern 752 formed on the uppermost metal layer of the peripheral circuit area PERI. In example embodiments, a contact may not be formed on the upper metal pattern 892 formed on the uppermost metal layer of the cell area CELL.

In example embodiments, a reinforced metal pattern having the same cross-section shape as the formed metal pattern may be formed on the uppermost metal layer of one of the cell area CELL and the peripheral circuit area PERI to correspond to the metal pattern formed on the uppermost metal layer of the other of the cell area CELL and the peripheral circuit area PERI. The contact may not be formed in the reinforced metal pattern.

The plurality of nonvolatile memories 600 may be connected to the storage controller, and the nonvolatile memories 600 may independently perform the programming operation and the read operation. According to example embodiments, the storage controller may adjust the number of nonvolatile memories 600 to which the data is to be programmed in parallel, that is, the striping number, according to the continuity of data received from the host.

Figure 16:
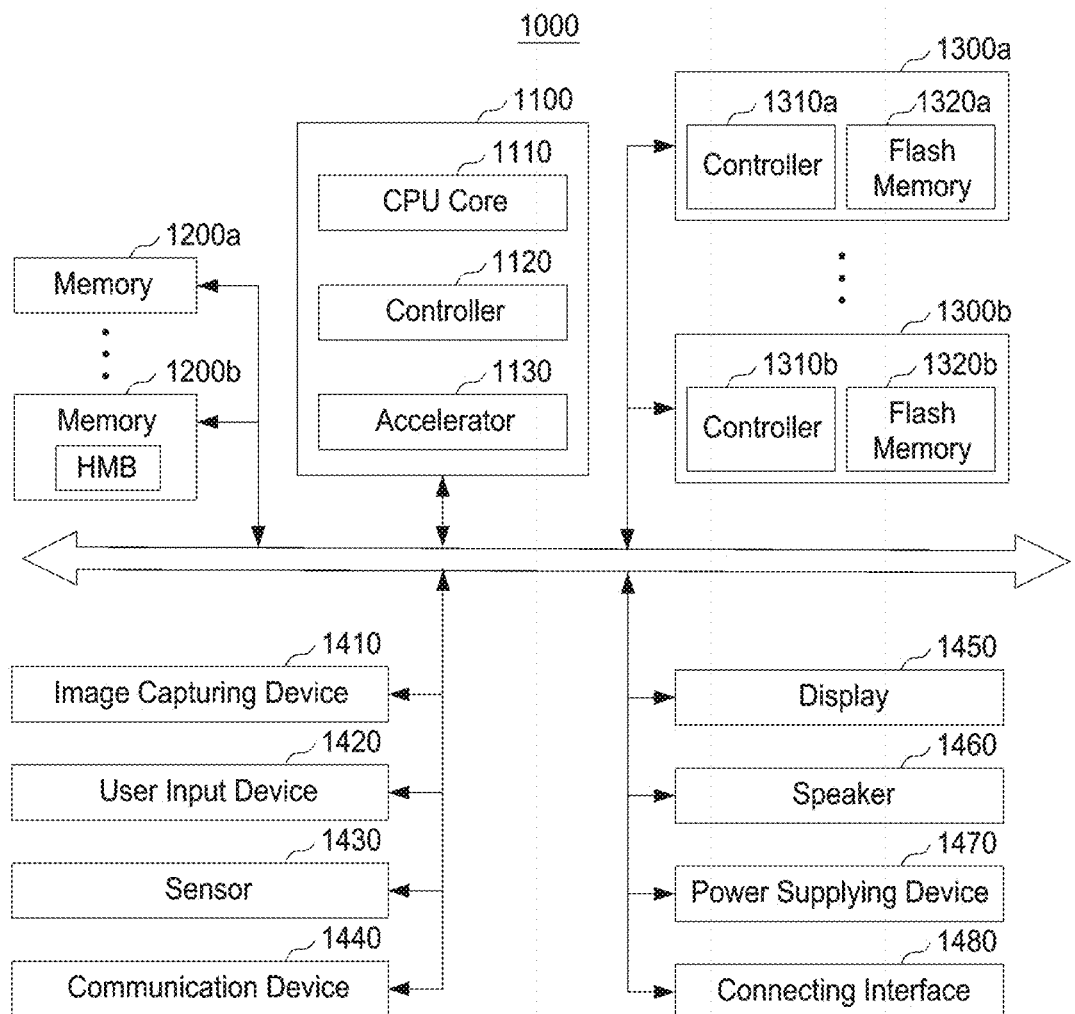
FIG. 16 is a diagram illustrating a system to which the storage device according to example embodiments is applied.

FIG. 16 is a diagram illustrating a system 1000 to which a storage device according to example embodiments are applied. The system 1000 of FIG. 16 may be basically a mobile phone, a smart phone, a tablet personal computer, a wearable device, a healthcare device, or a mobile system such as an Internet of things (IOT) device. However, the system 1000 of FIG. 16 is not necessarily limited to the mobile system, and may be a personal computer, a laptop computer, a server, a media player, or an automotive device such as a navigation device.

Referring to FIG. 16, the system 1000 may include one or more of a main processor 1100, memories 1200a and 1200b, and storage devices 1300a and 1300b, and additionally an image capturing device 1410, a user input device 1420, a sensor 1430, a communication device 1440, a display 1450, a speaker 1460, a power supplying device 1470, and a connecting interface 1480.

The main processor 1100 may control the overall operation of the system 1000, and more specifically, an operation of other components constituting the system 1000. Such a main processor 1100 may be implemented as a general-purpose processor, a dedicated processor, an application processor, or the like.

The main processor 1100 may include one or more CPU cores 1110 and may further include a controller 1120 for controlling the memories 1200a and 1200b and/or the storage devices 1300a and 1300b. According to example embodiments, the main processor 1100 may further include an accelerator 1130 that is a dedicated circuit for high-speed data operation such as artificial intelligence (AI) data operation. Such an accelerator 1130 may include a graphics processing unit (GPU), a neural processing unit (NPU), and/or a data processing unit (DPU), or the like, and may be implemented as a separate chip physically independent from other components of the main processor 1100.

The memories 1200a and 1200b may be used as a main memory device of the system 1000 and may include volatile memories such as SRAM and/or DRAM, but may include nonvolatile memories such as a flash memory, PRAM, and/or RRAM. The memories 1200a and 1200b may be implemented in the same package as the main processor 1100.

The storage devices 1300a and 1300b may function as nonvolatile storage devices that store data regardless of whether power is supplied, and may have a relatively larger storage capacity than the memories 1200a and 1200b. The storage devices 1300a and 1300b may include storage controllers 1310a and 1310b and nonvolatile memory (NVM) 1320a and 1320b that store data under the control of the storage controllers 1310a and 1310b. The nonvolatile memories 1320a and 1320b may include flash memories having a 2-dimensional (2D) structure or 3-dimensional (3D) vertical NAND (V-NAND) structure, but also include other types of nonvolatile memories such as PRAM and/or RRAM.

The storage devices 1300a and 1300b may be included in the system 1000 while being physically separated from the main processor 1100, or may be implemented in the same package as the main processor 1100. In addition, since the storage devices 1300a and 1300b may have the same shape as a solid state device (SSD) or a memory card, and thus, may be detachably coupled to other components of the system 1000 through an interface such as a connecting interface 1480 to be described later. Such storage devices 1300a and 1300b may be devices to which a standard protocol such as universal flash storage (UFS), embedded multi-media card (eMMC), or nonvolatile memory express (NVMe) is applied, but is not necessarily limited thereto.

According to example embodiments, the storage devices 1300a and 1300b may analyze the pattern of data received from the host and adjust the striping number according to the continuity of data. According to example embodiments, the read performance of continuous data may be improved and the write amplification of the nonvolatile memory may be alleviated.

The image capturing device 1410 may capture a still image or a moving image, and may be a camera, a camcorder, and/or a webcam, or the like.

The user input device 1420 may receive various types of data input from a user of the system 1000, and may be a touch pad, a keypad, a keyboard, a mouse, and/or a microphone, or the like.

The sensor 1430 may detect various types of physical quantities that may be obtained from the outside of the system 1000, and may convert the detected physical quantities into electrical signals. Such a sensor 1430 may be a temperature sensor, a pressure sensor, an illuminance sensor, a position sensor, an acceleration sensor, a biosensor, and/or a gyroscope sensor, or the like.

The communication device 1440 may transmit and receive signals between other devices outside the system 1000 according to various communication protocols. Such a communication device 1440 may be implemented to include an antenna, a transceiver, and/or a modem (MODEM), or the like.

The display 1450 and the speaker 1460 may function as output devices each of which outputs visual information and audio information to the user of the system 1000.

The power supplying device 1470 may appropriately convert power supplied from a battery (not illustrated) built into the system 1000 and/or an external power supply and supply the converted power to each component of the system 1000.

The connecting interface 1480 may provide a connection between the system 1000 and an external device connected to the system 1000 to transmit/receive data to/from the system 1000. The connecting interface 1480 may be implemented as various interface types such as advanced technology attachment (ATA), serial ATA (SATA), external SATA (e-SATA), a small computer small interface (SCSI), serial attached SCSI (SAS), peripheral component interconnection (PCI), PCI express (PCIe), NVMe, IEEE 1394, a universal serial bus (USB), a secure digital (SD) card, a multi-media card (MMC), eMMC, UFS, embedded universal flash storage (eUFS), a compact flash (CF) card.

According to example embodiments, the configurations and operations related to the storage device capable of dynamically changing the striping policy by analyzing the pattern of data received from the host may be provided.

According to example embodiments, the storage device may change the striping number based on the continuity of data received from the host to improve the read performance of continuous data and alleviate the write amplification despite the frequent flush request from the host.

In example embodiments, each of elements described above may be and/or include, for example, processing circuitry such as hardware, software, or the combination of hardware and software. For example, the processing circuitry more specifically may include (and/or be included in), but is not limited to, a processor (and/or processors), Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), graphics processing unit (GPU), etc.

Aspects to be solved by example embodiments are not limited to the above-described aspects. That is, other aspects that are not mentioned may be obviously understood by those skilled in the art from the following specification.

The present inventive concepts are not limited by the example embodiments described above and the accompanying drawings, but is intended to be limited by the appended claims. Therefore, various types of substitutions, modifications, and alterations may be made by those skilled in the art without departing from the spirit of the present inventive concepts as defined by the appended claims, and these substitutions, modifications, and alterations are to be fall within the scope of the present inventive concepts.

What is claimed is:

1. A storage device comprising:
   a plurality of nonvolatile memories, each including a plurality of multi-level cell memory blocks including a plurality of pages including multi-level memory cells storing plural bits of data, each of the plurality of pages providing sub-pages corresponding to a memory cell level, and each of the plurality of nonvolatile memories performing high-speed programming (HSP) operation to program the sub-pages included one of the plurality of pages in one-time operation; and
   a controller configured to control the plurality of nonvolatile memories,
   wherein the controller is configured to buffer data chunks received along with write commands from a host, is configured to determine a size of continuous data based on a start logical address and a chunk size of the data chunks, is configured to determine a striping number indicating a number of nonvolatile memory which is for distributing and storing the data chunks in sub-page units based on the size of continuous data, and is configured to distribute and provide the data chunks in the sub-page unit to one or more nonvolatile memories selected from among the plurality of nonvolatile memories based on the determined striping number, and the one or more selected nonvolatile memories are configured to perform the HSP operation on the provided data chunks in parallel.

2. The storage device of claim 1, wherein the controller is configured to determine any one of candidate striping numbers as the striping number according to a result of comparing a value obtained by dividing the size of continuous data by a sub-page size with a given candidate striping number.

3. The storage device of claim 2, further comprising:

a plurality of log blocks including multi-level cell memory blocks allocated one by one from the plurality of nonvolatile memories, wherein each of the plurality of log blocks corresponds to a different candidate striping number, and the controller is configured to select any one log block from among the plurality of log blocks based on the determined striping number, and is configured to select at least one nonvolatile memory from among the plurality of nonvolatile memories to store the data chunks in the selected log block.

4. The storage device of claim 2, further comprising:

a log block including multi-level cell memory blocks allocated one by one from the plurality of nonvolatile memories, wherein the controller is configured to select one or more multi-level cell memory blocks into which data is to be programmed from the log block based on the determined striping number, and is configured to provide the data chunks to one or more nonvolatile memories including the selected multi-level cell memory block.

5. The storage device of claim 2, wherein the candidate striping number includes a first striping number having a smallest size, a second striping number having a medium size, and a third striping number having a largest size, and the controller is configured to determine the striping number as a first striping number when the size of continuous data is less than or equal to a first threshold value, is configured to determine the striping number as a second striping number when the size of continuous data is greater than the first threshold value and less than or equal to a second threshold value, and is configured to determine the striping number as a third striping number when the size of continuous data is greater than the second threshold value.

6. The storage device of claim 1, wherein the controller is configured to determine the striping number so that the striping number increases as the size of continuous data increases.

7. The storage device of claim 1, wherein each of the plurality of nonvolatile memories further includes single-level cell memory blocks, the single-level cell memory blocks provide a backup program area, and the multi-level cell memory blocks provide a main program area.

8. The storage device of claim 7, wherein the controller is configured to receive a flush command from the host, when a size of the buffered data chunks is greater than or equal to a given size, is configured to provide data having the given size among the data chunks to the main program area, and when the size of the buffered data chunks is smaller than the given size, is configured to provide the data chunks to the backup program area.

9. The storage device of claim 8, the given size is determined based on the striping number and the number of data bits in which each of the memory cells is stored.

10. The storage device of claim 1, wherein when a last logical address of a preceding data chunk and a start logical address of a subsequent data chunk are continuous among the data chunks, the controller is configured to sum chunk sizes of the preceding data chunk and the subsequent data chunk to determine the size of continuous data.

11. An operation method of a storage device including a plurality of nonvolatile memories each including multi-level cell memory blocks including a plurality of pages, the operation method comprising:

receiving a write command, a start logical address, a current data chunk, and chunk size information from a host;

determining a size of continuous data based on the start logical address and the chunk size information;

determining a striping number indicating a number of nonvolatile memory which is for distributing and storing the data chunks in sub-page units provided in each of the plurality of pages according to memory cell level, based on the size of continuous data;

providing the data chunk to one or more nonvolatile memories selected from among the plurality of nonvolatile memories based on the determined striping number; and performing, with the one or more selected nonvolatile memories, a high-speed programming (HSP) operation to program sub-pages including one of the plurality of pages in one-time operation on the provided data chunks in parallel.

12. The operation method of claim 11, wherein the determining of the size of continuous data based on the start logical address and the chunk size information includes:

determining a last logical address of the preceding data chunk based on a start logical address of a data chunk preceding the current data chunk and the chunk size information; and determining the size of continuous data by summing the chunk sizes of the current data chunk and the preceding data chunk when the start logical address of the current data chunk and the last logical address of the previous data chunk are continuous to each other.

13. The operation method of claim 12, wherein the determining of the size of continuous data based on the start logical address and the chunk size information further includes determining the chunk size of the current data chunk as the size of continuous data when the start logical address of the current data chunk and the last logical address of the preceding data chunk are not continuous to each other.

14. The operation method of claim 11, wherein the determining of the striping number based on the size of continuous data includes determining any one of a plurality of candidate striping numbers as the striping number according to whether the size of continuous data exceeds a given threshold value.

15. The operation method of claim 11, wherein the determining of the striping number based on the size of continuous data includes determining the striping number so that the striping number increases as the size of continuous data increases.

16. A controller controlling a plurality of nonvolatile memories, each including multi-level cell memory blocks each including a plurality of pages, comprising:
- a buffer memory configured to buffer data received along with write commands from a host; and
- a processor configured to determine a size of continuous data based on a logical address and a chunk size of the buffered data, configured to determine a striping number indicating a number of nonvolatile memory for distributing and storing the buffered data in sub-page units corresponding memory cell level in one page based on the size of continuous data, and configured to provide the buffered data to at least one nonvolatile memory selected from among the plurality of nonvolatile memories based on the determined striping number to be programmed the buffered data in sub-pages included in one page in one-time operation.

17. The controller of claim 16, wherein the processor is configured to determine any one of a plurality of candidate striping numbers as the striping number according to whether the size of continuous data exceeds a given threshold value.

18. The controller of claim 16, wherein the processor is configured to determine the striping number so that the striping number increases as the size of continuous data increases.

19. The controller of claim 16, wherein the processor is configured to determine the number of continuous logical addresses among logical addresses of the buffered data, and is configured to determine the size of continuous data based on the number of continuous logical addresses.

20. The controller of claim 16, wherein the processor is configured to distribute and provides the buffered data in response to a flush command from the host.

* * * * *